(12) United States Patent
Patolsky et al.

(10) Patent No.: US 9,536,737 B2
(45) Date of Patent: Jan. 3, 2017

(54) NANOSTRUCTURE AND PROCESS OF FABRICATING SAME

(75) Inventors: Fernando Patolsky, Rechovot (IL); Alexander Pevzner, Kiryat-Ekron (IL); Yoni Engel, RaAnana (IL); Roey Elnathan, Jerusalem (IL); Alexander Tsukernik, Vaughan (CA); Zahava Barkay, Ramat-HaSharon (IL)

(73) Assignee: Tracense Systems Ltd., Herzlia (IL)

( * ) Notice: Subject to any disclaimer, the term of this patent is extended or adjusted under 35 U.S.C. 154(b) by 0 days.

(21) Appl. No.: 14/370,083

(22) PCT Filed: Jan. 1, 2012

(86) PCT No.: PCT/IB2012/050002
§ 371 (c)(1),
(2), (4) Date: Jul. 1, 2014

(87) PCT Pub. No.: WO2013/098657
PCT Pub. Date: Jul. 4, 2013

(65) Prior Publication Data
US 2014/0367834 A1    Dec. 18, 2014

(51) Int. Cl.
*H01L 29/06* (2006.01)
*H01L 21/02* (2006.01)
(Continued)

(52) U.S. Cl.
CPC ....... *H01L 21/02645* (2013.01); *B82B 3/0038* (2013.01); *H01L 21/0237* (2013.01);
(Continued)

(58) Field of Classification Search
CPC .......... H01L 29/0673; H01L 21/02603; H01L 21/02645
See application file for complete search history.

(56) References Cited

U.S. PATENT DOCUMENTS 7,238,594 B2 *   7/2007   Fonash et al. ................ 438/478
7,385,295 B2 *   6/2008   Son et al. ..................... 257/776
(Continued)

FOREIGN PATENT DOCUMENTS

CN         102210013        10/2011
DE         60212118         1/2007
(Continued)

OTHER PUBLICATIONS

Shan et al. "From Si Source Gas Directly to Positioned, Electrically Contacted Si Nanowires: The Self-Assembling 'Grow-in-Place' Approach", Nano Letters, XP055036341, 4(11): 2085-2089, Nov. 1, 2004.*
(Continued)

*Primary Examiner* — Matthew Reames
*Assistant Examiner* — Vincent Wall

(57) ABSTRACT

A process of fabricating a nanostructure is disclosed. The process is effected by growing the nanostructure in situ within a trench formed in a substrate and having therein a metal catalyst selected for catalyzing the nanostructure growth, under the conditions in which the growth is guided by the trench. Also disclosed are nanostructure systems comprising a nanostructure, devices containing such systems and uses thereof.

21 Claims, 14 Drawing Sheets
(6 of 14 Drawing Sheet(s) Filed in Color)

(51) Int. Cl.
*B82B 3/00* (2006.01)
*H01L 29/861* (2006.01)
*H01L 27/06* (2006.01)

(52) U.S. Cl.
CPC .... *H01L 21/0262* (2013.01); *H01L 21/02521* (2013.01); *H01L 21/02603* (2013.01); *H01L 21/02653* (2013.01); *H01L 27/0688* (2013.01); *H01L 29/0673* (2013.01); *H01L 29/861* (2013.01)

(56) References Cited

U.S. PATENT DOCUMENTS

| | | | | |
|---|---|---|---|---|
| 7,538,337 | B2* | 5/2009 | Hijzen | B82Y 10/00 257/3 |
| 7,790,610 | B2 | 9/2010 | Lee et al. | |
| 2005/0117441 | A1* | 6/2005 | Lieber | B82Y 10/00 365/232 |
| 2005/0176228 | A1* | 8/2005 | Fonash | B81C 1/0019 438/597 |
| 2008/0009434 | A1 | 1/2008 | Reches et al. | |
| 2008/0135826 | A1* | 6/2008 | Fonash et al. | 257/9 |
| 2008/0237886 | A1 | 10/2008 | Wu et al. | |
| 2009/0057653 | A1* | 3/2009 | Lee et al. | 257/37 |
| 2011/0212621 | A1* | 9/2011 | Yoshida | C09G 1/02 438/693 |
| 2012/0193602 | A1* | 8/2012 | Lieber | B82Y 10/00 257/5 |

FOREIGN PATENT DOCUMENTS

| | | |
|---|---|---|
| DE | 112008000800 | 7/2010 |
| DE | 112008003839 | 3/2011 |
| EP | 1388521 | 2/2004 |
| EP | 2298968 | 3/2011 |
| EP | 2352167 | 8/2011 |
| FR | 2926163 | 7/2009 |
| FR | 2926163 A1 * | 7/2009 |
| JP | 2003-504857 | 2/2003 |
| KR | 10-2011-0090920 | 8/2011 |
| TW | 201018721 | 5/2010 |
| WO | WO 2005/072089 | 8/2005 |
| WO | WO 2009/136906 | 11/2009 |
| WO | WO 2010/052983 | 5/2010 |
| WO | WO 2011/038228 | 3/2011 |
| WO | WO 2013/098657 | 7/2013 |

OTHER PUBLICATIONS

FR 2926163 A1—machine translation.*
International Search Report and the Written Opinion Dated Sep. 3, 2012 From the International Searching Authority Re. Application No. PCT/IB2012/050002.
Recherchebericht [Search Report] Dated Jan. 29, 2013 From the Deutsches Patent—und Markenamt [German Patent and Trademark Office] Re. Application No. 202012102039.4. German Only!
Pevzner et al. "Confinement-Guided Shaping of Semiconductor Nanowires and Nanoribbons: 'Writing With Nanowires'", Nano Letters, XP055036343, 12(1): 7-12, Dec. 5, 2011.
Notice of Reason for Rejection Dated Dec. 4, 2015 From the Japanese Patent Office Re. Application No. 2014-549562.
Barkay et al. "Study of the SuperconductingCs-Doped WO3 Crystal Surface by Electron Backscattered Diffraction", Journal of Superconductivity and Novel Magnetism, 21(2): 145-150, Published Online Jan. 24, 2008.
Tian et al. "Single-Crystalline Kinked Semiconductor Nanowire Superstructures", Nature Nanotechnology, 4(12): 824-829, Published Online Oct. 18, 2009.
Chen et al. "Wafer-Scale Synthesis of Single-Crystal Zigzag Silicon Nanowire Arrays With Controlled Turning Angles", Nano Letters, 10(3): 864-868, Published on Web Jan. 27, 2010.
Deal et al. "EBSD Geometry in the SEM: Simulation and Representation", Surface and Interface Analysis, 37(11): 1017-1020, Published Online Oct. 31, 2005.
Geblinger et al. "Self-Organized Nanotube Serpentines", Nature Nanotechnology, 3(4): 195-200, Published Online Mar. 30, 2008.
Prikhodko et al. "In Situ Electron Backscattered Diffraction of Individual GaAs Nanowires", Ultramicroscopy, 109(1): 133-138, Published Online Oct. 7, 2008.

* cited by examiner

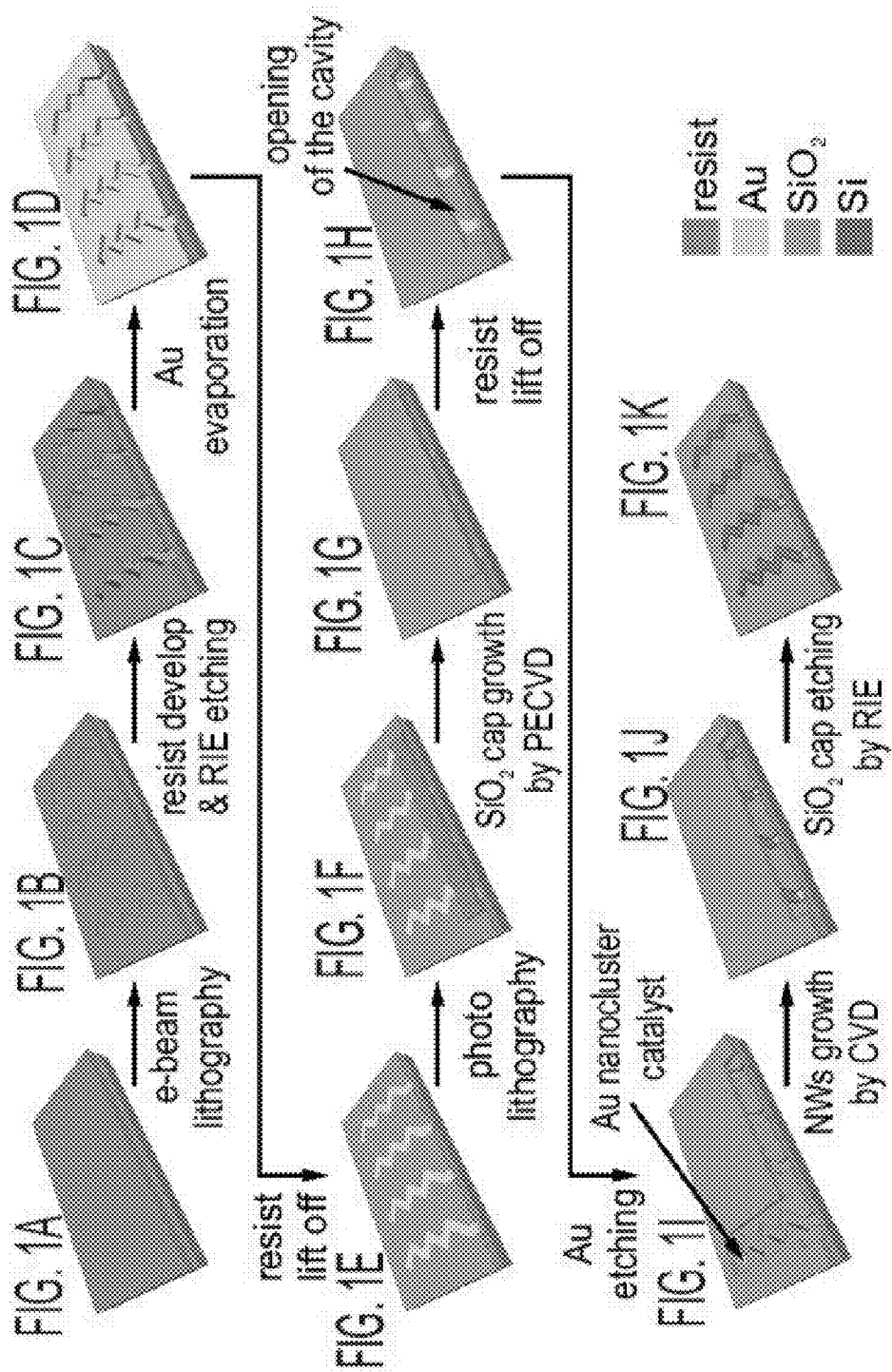

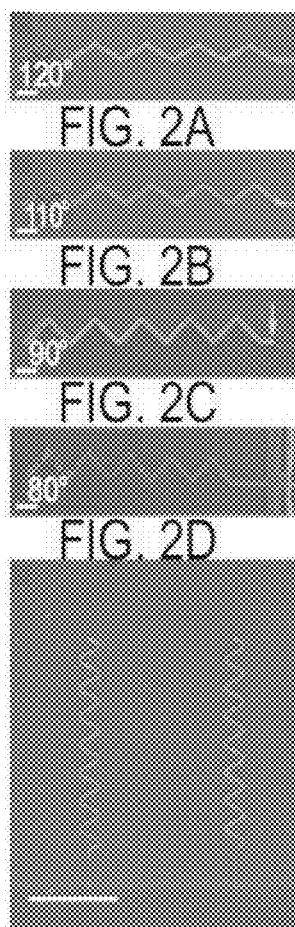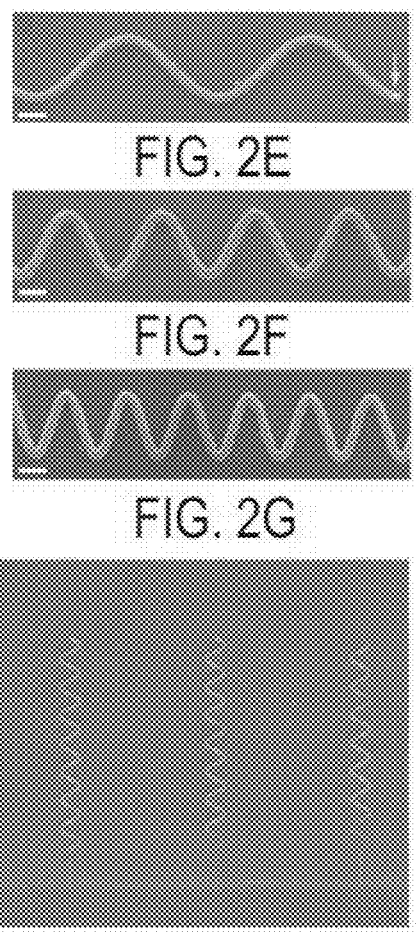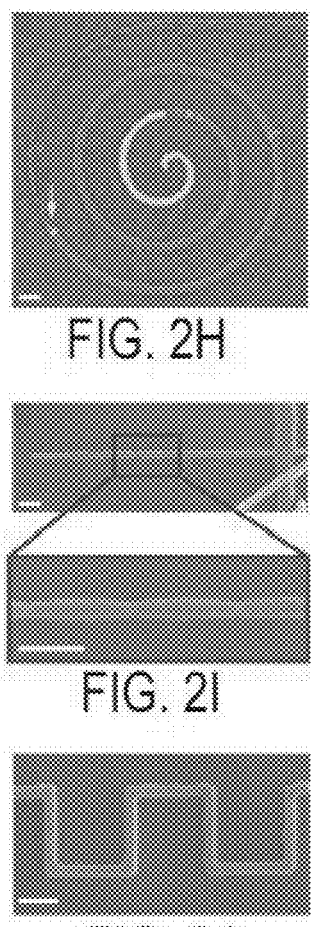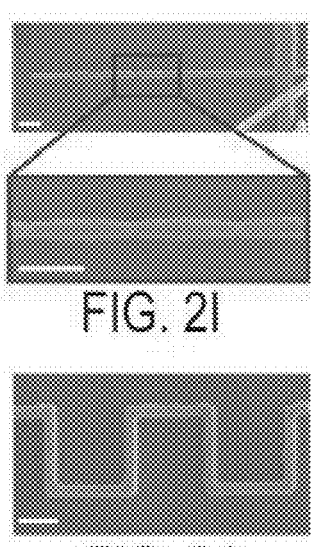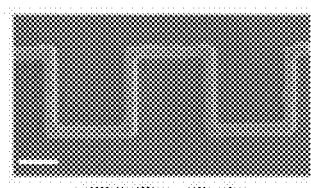
FIG. 2A
FIG. 2B
FIG. 2C
FIG. 2D
FIG. 2E
FIG. 2F
FIG. 2G
FIG. 2H
FIG. 2I
FIG. 2J
FIG. 2K

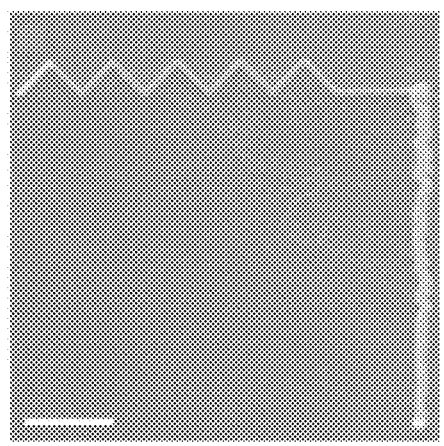
FIG. 3A
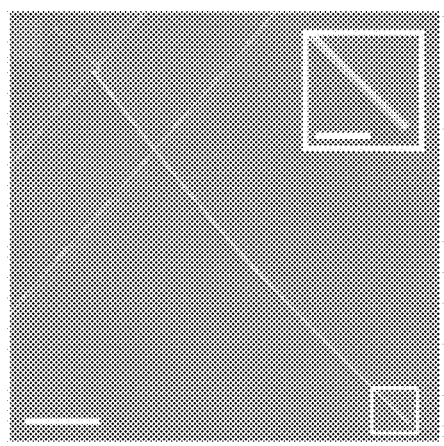
FIG. 3B
FIG. 4A
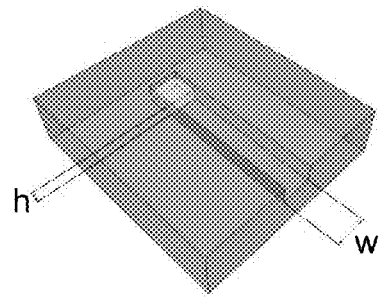
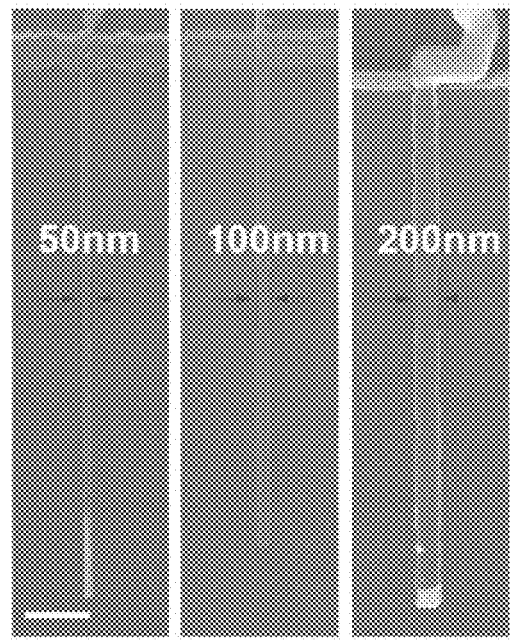
FIG. 4B   FIG. 4C   FIG. 4D

NANOSTRUCTURE AND PROCESS OF FABRICATING SAME

RELATED APPLICATIONS

This application is a National Phase of PCT Patent Application No. PCT/IB2012/050002 having International filing date of Jan. 1, 2012, the contents of which are incorporated by reference as if fully set forth herein in its entirety.

FIELD AND BACKGROUND OF THE INVENTION

The present invention, in some embodiments thereof, relates to nanotechnology and, more particularly, but not exclusively, to a nanostructure, a process of producing same and a system containing and utilizing same.

In recent years, one dimensional (1D) nanomaterials such as carbon nanotubes and semiconductor nanowires/nanotubes have been intensively explored as potential building blocks for multiple electronic, optoelectronic and biosensing applications. Extensive efforts have been devoted to the synthesis of semiconductor nanowires with controlled chemical and physical properties such as: dimension, chemical composition, doping and crystal structure. Such shaped-controlled semiconductor nanowires are recognized as capable of exhibiting novel electrical and optical properties, and of being efficiently utilized in the fabrication of devices with fewer welding joints and improved electrical connections.

However, although some significant synthetic advances were achieved, the ability to control nanowire's geometry has been significantly limited.

A certain limited degree of complexity in silicon nanowire geometry was recently demonstrated using a 'nanotectonic' approach [Tian et al. Nat Nanotechnol 2009, 4, (12), 824-9]. This methodology provides iterative control over nanowire nucleation and growth, affording kinked silicon nanowires in which straight sections of controllable length are separated by 120° triangular joints. Nanowires geometries obtained by this method are limited to kinked triangular nanowire structures.

WO 2011/038228 discloses bent nanowires, having one or more kinks and a defined crystallographic orientation. Methods of preparing such nanowires are also disclosed.

In another report [Chen et al. Nano Letters 2010, 10, (3), 864-868], a metal-assisted chemical etching approach was employed, allowing the synthesis of zigzagged silicon nanowires with 150°, 125° or 90° turning angles by controlling the crystallographic orientation of the Si mother wafer, reaction temperature, and etchant concentration.

Wavy carbon nanotubes serpentines structures were also synthesized by a crystalline surface-directed "nanotube epitaxy" method [Geblinger et al. Nat Nano 2008, 3, (4), 195-200].

The overall quality of the as-synthesized nanowires is rather low and the shape of the nanowires obtained varies along the wafer surface. The currently known methodologies therefore lead to nanowires of limited-controlled shapes, and further, to nanowires that must be harvested from the donor substrates if further fabrication of devices is required.

Additional background art includes U.S. Pat. No. 7,538,337.

SUMMARY OF THE INVENTION

The present inventors have designed a confinement-guided method for growing nanostructures (e.g., nanowires and/or nanoribbons), that enables to control both the chemical and physical attributes of the synthesized nanostructures, and further allows a perfect and unlimited control over their geometry. The herein disclosed method allows the synthesis of semiconductor nanostructures (e.g., nanowires and/or nanoribbons) in a wide variety of two dimensional shapes such as any kinked (different turning angles), sinusoidal, linear and spiral shapes, so that practically any desired geometry can be achieved. The shape-controlled nanostructure can be grown on almost any substrate, including silicon wafer, quartz and glass slides, and even on plastic substrates (e.g. Kapton HN).

According to an aspect of some embodiments of the present invention there is provided a process of fabricating a nanostructure, comprising growing the nanostructure in situ within a trench formed in a substrate and having in the trench a metal catalyst selected for catalyzing the growth, under conditions that the growth is guided by the trench.

According to some embodiments of the invention the growth is under conditions that the direction of growth is generally parallel to opposing major surfaces of the substrate.

According to some embodiments of the invention the trench is at least partially buried within the substrate under a protective layer covering one of the major surfaces during the growth.

According to some embodiments of the invention the trench has an open end and a closed end, wherein the metal catalyst is at the closed end and wherein the growth is generally along a direction pointing from the closed end to the open end.

According to some embodiments of the invention the process comprises removing the protective layer, so as to expose the nanostructure.

According to some embodiments of the invention the metal catalyst occupies a length of at most 300 nm along a longitudinal direction of the trench.

According to some embodiments of the invention a linear distance between a first end of the trench and a second end of the trench is at least 1 μm.

According to some embodiments of the invention the substrate is formed with a plurality of trenches and wherein the process comprises growing a nanostructure in situ within at least two of the plurality of trenches.

According to some embodiments of the invention process comprises, prior to the growth, placing the metal catalyst within the trench.

According to some embodiments of the invention the placing comprises: evaporating a metal catalyst material into the trench so to at least partially fill the trench by the metal catalyst material; and etching a portion of the metal catalyst material off the trench under controlled conditions selected so as to maintain a remnant of the metal catalyst material within the trench.

According to some embodiments of the invention the evaporating the metal catalyst material into the trench comprises, evaporating the metal catalyst material onto a surface of the substrate including the trench, and removing the metal catalyst material from the surface, thereby leaving the metal catalyst material only in the trench.

According to some embodiments of the invention the removing is effected by a liftoff process.

According to some embodiments of the invention the process comprises forming the trench in the substrate.

According to some embodiments of the invention the trench is formed by a lithography process followed by an etching process.

According to some embodiments of the invention the trench is a branched trench having at least one branch point connecting a first trench section entering the branch point with trench sections exiting the branch point.

According to some embodiments of the invention the growing is along a direction from the first trench section, pass the branching point and into each of the trench and into at least two of the trench sections exiting the branch point.

According to some embodiments of the invention the process comprises covering a surface of the substrate by a protective layer such as to bury the trench under the protective layer.

According to some embodiments of the invention the process comprises forming an opening in the protective layer at an end of the substrate to form an open-ended trench.

According to some embodiments of the invention the substrate is formed with a plurality of trenches arranged to form a crossbar array having at least a first group of trenches having a first depth, and a second group of trenches having a second depth being smaller than the first depth, and wherein the growing comprises, growing nanostructures within the first group of trenches without growing nanostructures within the second group of trenches, and subsequently growing nanostructures within the second group of trenches.

According to some embodiments of the invention during the growth of the nanostructures within the first group, the trenches in the first group are open at one side and the trenches in the second group are closed both sides, and wherein the process further comprises, forming an opening at one side of the trenches in the second group, prior to the growth of the nanostructures within the second group.

According to some embodiments of the invention the growing is effected by chemical vapor deposition.

According to some embodiments of the invention the nanostructure is made of a semiconductor material.

According to some embodiments of the invention the semiconductor material comprises at least one material selected from the group consisting of silicon, germanium, silicon-germanium alloy, silicon carbon alloy, silicon-germanium-carbon alloy, gallium nitride, gallium arsenide, indium arsenide, indium phosphide, indium nitride, a III-V compound semiconductor material, a II-VI compound semiconductor material, and an organic semiconductor material.

According to some embodiments of the invention the metal catalyst comprises at least one material selected from the group consisting of gold, nickel, aluminum, cobalt, silver, copper, platinum, chromium, titanium, palladium and iron.

According to some embodiments of the invention the substrate is made of at least one material selected from the group consisting of silica, silicon, GaN, InP, GaAs, InGaP, Si3N4, Al2O3, ZnO, ZrO2, quartz, glass, a polymer or copolymer and plastic, and any combination thereof.

According to some embodiments of the invention the trench has a shape selected from the group consisting of straight, kinked, wavy, curvilinear, spiral, serpentine, cycloid and any combination thereof.

According to some embodiments of the invention at least part of the trench has a shape of a space curve.

According to some embodiments of the invention the nanostructure features a substantially uniform crystallinity.

According to some embodiments of the invention the nanostructure features a non-uniform crystallinity.

According to some embodiments of the invention the process comprises selectively removing walls of the trench, such that the nanostructure from a relief pattern over so an exposed surface of the substrate.

According to an aspect of some embodiments of the present invention there is provided a nanostructure system, comprising a substrate and a nanostructure fabricated by the process as delineated above and optionally as further detailed hereinbelow.

According to an aspect of some embodiments of the present invention there is provided a nanostructure system. The system comprises: a substrate having a first major surface and a second major surface; and a nanostructure embedded within the first major surface, generally parallel thereto and generally flush therewith.

According to an aspect of some embodiments of the present invention there is provided a nanostructure system. The system comprises: a substrate having a first major surface and a second major surface; and a nanostructure forming a relief pattern over an exposed surface of the substrate.

According to some embodiments of the invention the system comprises a plurality of nanostructures.

According to some embodiments of the invention the plurality of nanostructures is arranged as a three-dimensional crossbar array.

According to some embodiments of the invention the crossbar array is a three-dimensional crossbar array having at least two levels at different vertical locations with respect to the first major surface, and wherein nanostructures of one of the at least two levels are spaced apart from nanostructures of another of one of the at least two levels.

According to an aspect of some embodiments of the present invention there is provided an electronic circuitry system comprising the system as delineated above and optionally as further detailed hereinbelow.

According to an aspect of some embodiments of the present invention there is provided an optoelectronic system comprising the system as delineated above and optionally as further detailed hereinbelow.

According to an aspect of some embodiments of the present invention there is provided a sensor comprising the system as delineated above and optionally as further detailed hereinbelow.

According to an aspect of some embodiments of the present invention there is provided a diode system comprising the system as delineated above and optionally as further detailed hereinbelow.

According to an aspect of some embodiments of the present invention there is provided a transistor system comprising the system as delineated above and optionally as further detailed hereinbelow.

According to an aspect of some embodiments of the present invention there is provided a memory system comprising the system as delineated above and optionally as further detailed hereinbelow.

According to an aspect of some embodiments of the present invention there is provided an imaging system comprising the system as delineated above and optionally as further detailed hereinbelow.

According to an aspect of some embodiments of the present invention there is provided a display system comprising the system as delineated above and optionally as further detailed hereinbelow.

According to an aspect of some embodiments of the present invention there is provided a projector display system comprising the system as delineated above and optionally as further detailed hereinbelow.

According to an aspect of some embodiments of the present invention there is provided an identification tag system comprising the system as delineated above and optionally as further detailed hereinbelow.

According to an aspect of some embodiments of the present invention there is provided a smart card system comprising the system as delineated above and optionally as further detailed hereinbelow.

According to an aspect of some embodiments of the present invention there is provided a process of fabricating nanostructure system, comprising forming a trench in a substrate; depositing the trench a metal catalyst material capable of catalyzing growth of a nanostructure within the trench; at least partially covering the substrate and the filled trenched with a protective layer such as to at least partially bury the trench under the protective layer; partially etching the metal catalyst material so as to maintain a remnant of the metal catalyst material within the trench; growing the nanostructure within the trench; and removing the protective layer.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

Figure 5A:
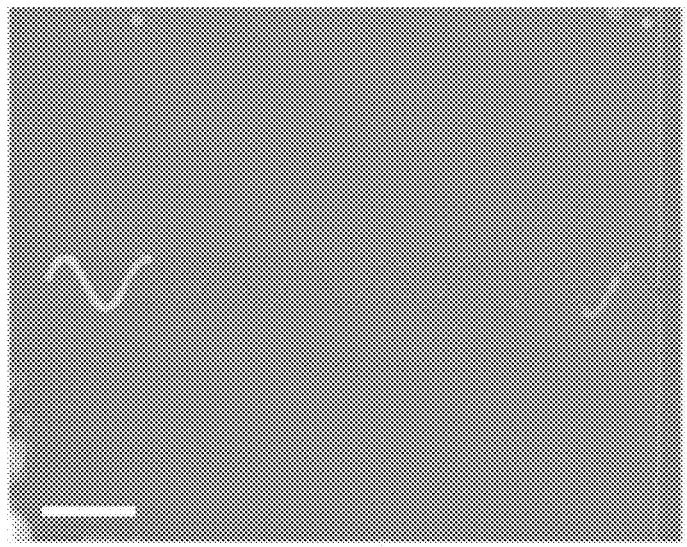

FIGS. 1A-K is a schematic illustration of an exemplary method of producing shape-guided nanowires according to some embodiments of the present invention, as is described in detail in Example 1 hereinafter.

FIGS. 2A-K present SEM images of exemplary nanowires according to some embodiments of the present invention, having a wide variety of 2D shapes. FIG. 2A presents a SEM image of multiply-kinked two-dimensional Si nanowire with a turning angle of 120° (scale bar 250 nm). FIG. 2B presents a SEM image of multiply-kinked two-dimensional Si nanowire with a turning angle of 110° (scale bar 250 nm). FIG. 2C presents a SEM image of multiply-kinked two-dimensional Si nanowire with a turning angle of 90° (scale bar 250 nm), with the yellow arrow indicating the position of the nanocluster catalyst. FIG. 2D presents a SEM image of multiply-kinked two-dimensional Si nanowire with a turning angle of 80° (scale bar 250 nm). FIGS. 2E-G present SEM images of sinusoidal shaped two-dimensional silicon nanowires with different periods (scale bars are 250 nm). The yellow arrow in FIG. 2E indicates the position of the nanocluster catalyst. FIG. 2H presents a SEM image of a two-dimensional spiral-shaped Si nanowire (scale bar 250 nm), with the yellow arrow indicating the position of the nanocluster catalyst. FIG. 2I presents a SEM image of a 1D shape-controlled SiNW, obtained by modulation of nanotunnel shape along the growth direction (upper image; scale bar 250 nm), and a zoom-in image thereof (lower image). FIG. 2J presents a SEM image of a square-wave shaped silicon nanowire (scale bar 250 nm). FIG. 2K presents a SEM image of a sample showing multiple sinusoidal-shaped silicon nanowires (scale bar 2.5 μm).

FIGS. 3A-B present SEM images of nanowires which were allowed to continue growing out of the nanotunnels (FIG. 3A; scale bar 1 μm and of surface-confined nanowires grown by VLS mechanism, as evidenced by the gold nanoparticle catalyst at the ending growth tip (marked by the white rectangle) (FIG. 3B; scale bar 5 μm), with the insert showing magnification of the ending growth tip.

FIGS. 4A-D present a schematic illustration of trenches formed within the substrate and of a gold catalyst used for growing nanowires within the trenches, further illustrating the dimensions of the nanowires as determined by the width of the trench and thickness of the evaporated gold layer; and SEM images (scale bar 500 nm) of straight Si nanowires, grown using the methodology disclosed herein, and having a width of 50 nm (FIG. 4B), 100 nm (FIG. 4C) and 200 nm (FIG. 4D).

Figure 5B:
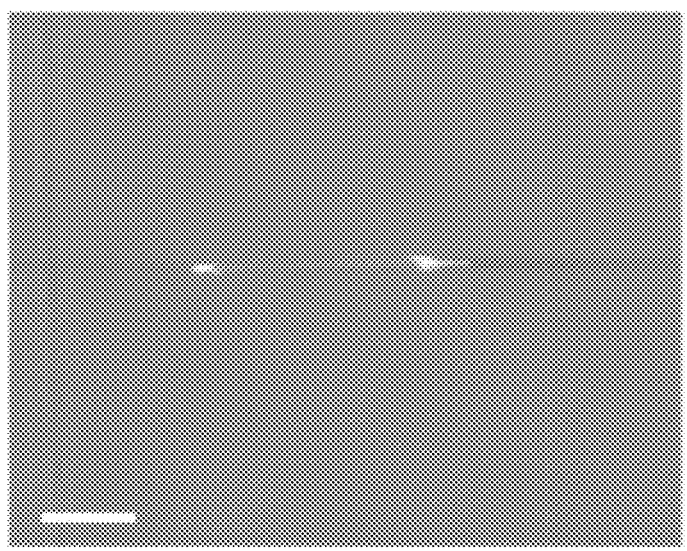

FIGS. 5A-B present a SEM image of a sinusoidal shape two-dimensional Si nanowire grown on a quartz substrate (FIG. 5A, scale bar 1 μm); and a SEM image of a straight Ge nanowire grown on a plastic (Kapton HN) substrate (FIG. 5B; scale bar 1 μm), both images obtained using a low vacuum SEM mode.

Figures 6A, 6B:
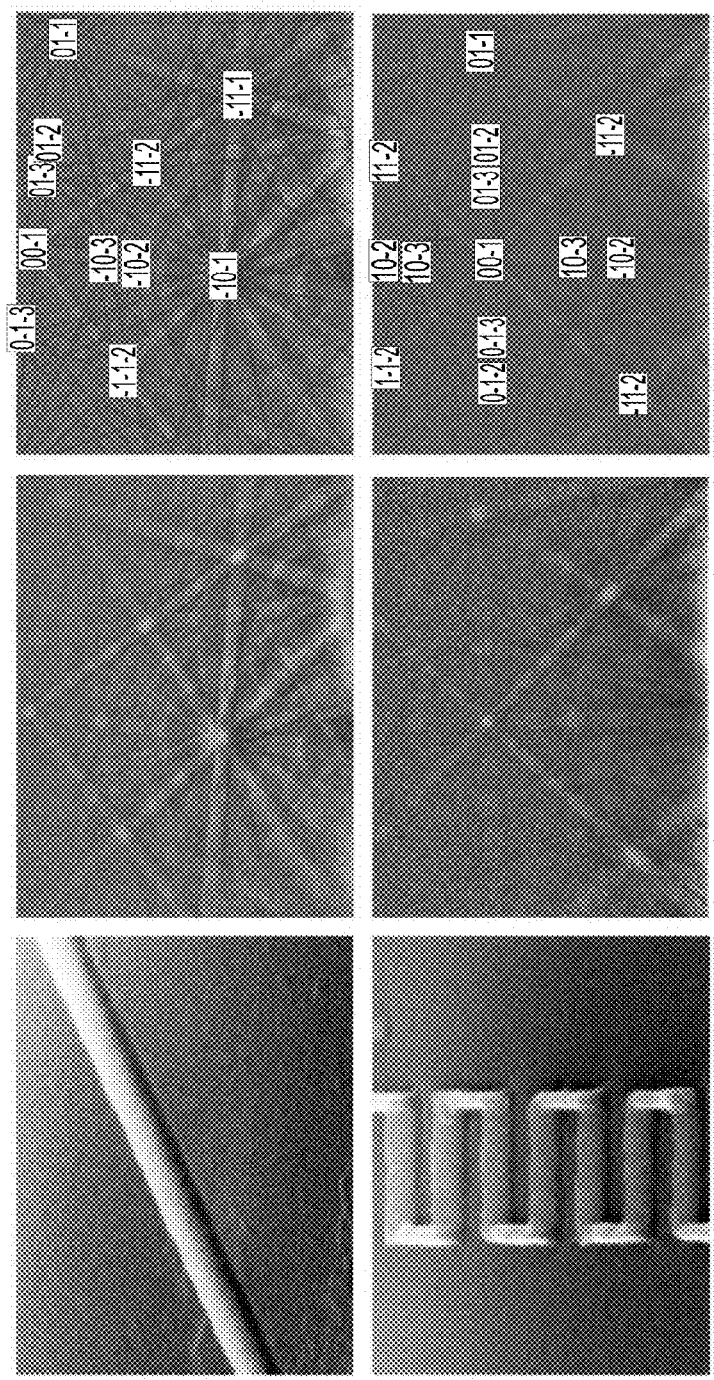
Figures 6C, 6D:
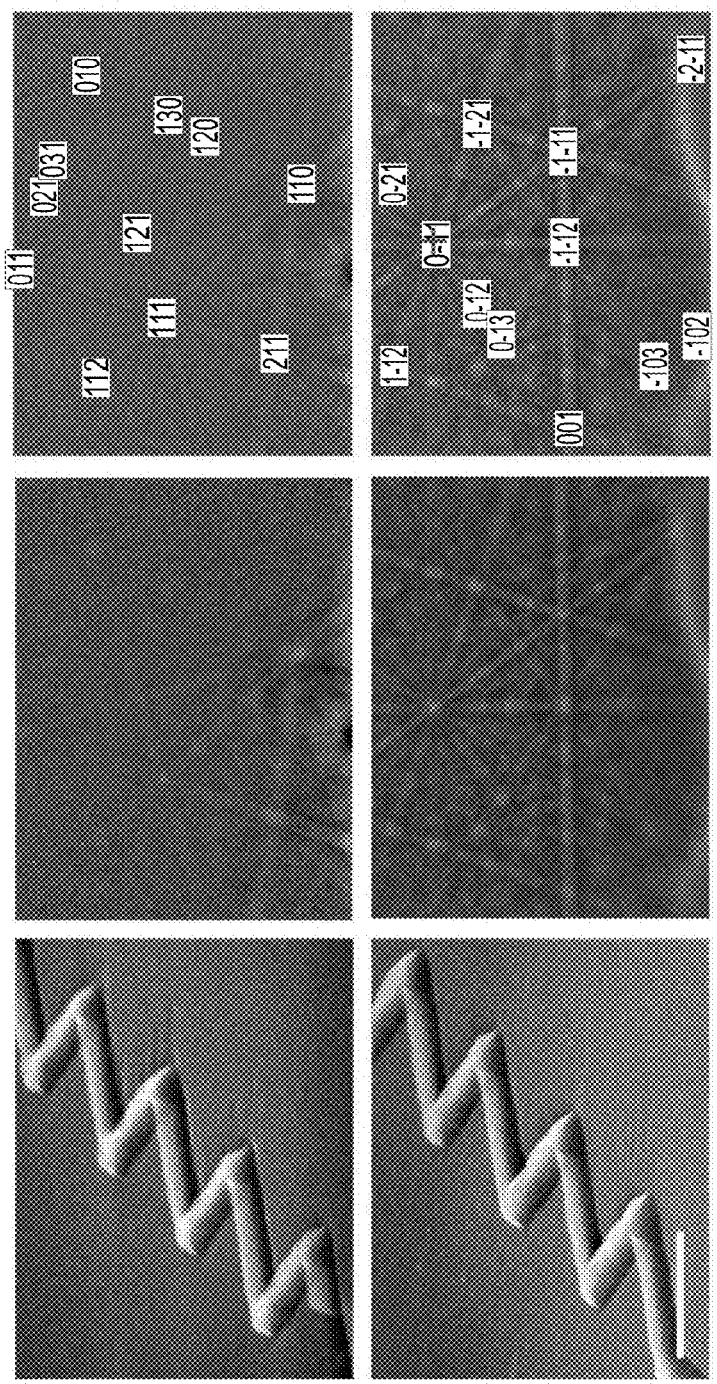

FIGS. 6A-D present data obtained in Electron backscattering diffraction (EBSD) analysis of Si nanowires with different shapes (FIGS. 6A-C) and of a Ge multiply-kinked nanowire (FIG. 6D). The left panel shows secondary electron images (70° tilt) of the tested nanowires; and the center and right panels show the corresponding raw and indexed EBSD Kikuchi patterns, respectively. The scale bar is 250 nm.

Figure 7:
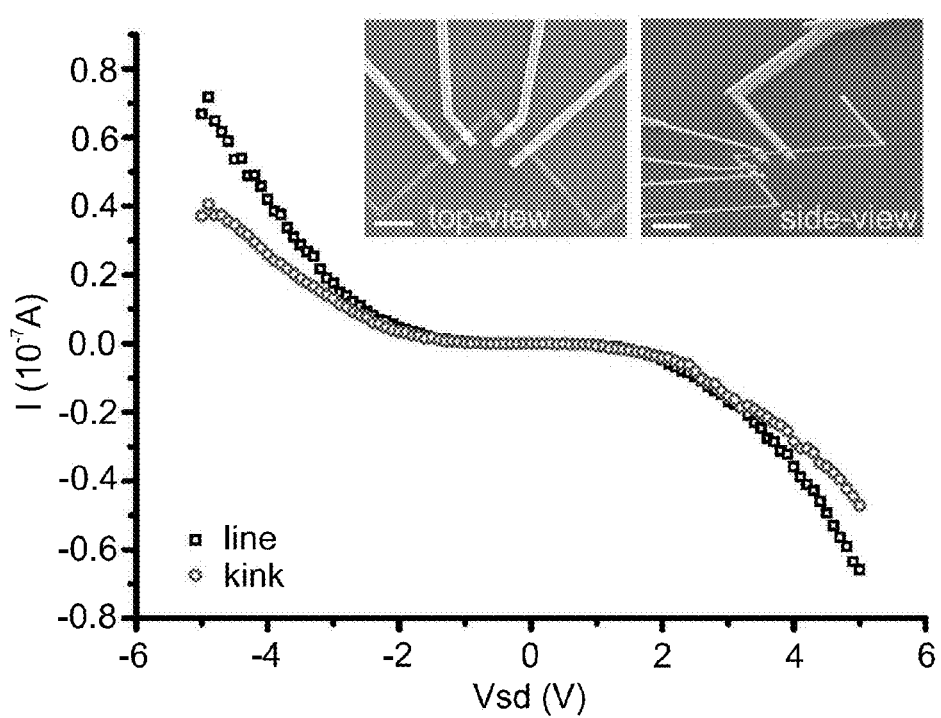

FIG. 7 presents electrical measurements, $V_{sd}$ versus $I_{sd}$, performed on the straight section of a zigzagged nanowire (black curve) and of the kinked section of the same nanowire structure (red curve). Top-view and Side-view SEM images of the electrical device are shown in the inserts.

FIG. 8A-E are schematic illustrations of a nanostructure system, according to some embodiments of the present invention.

Figure 9:
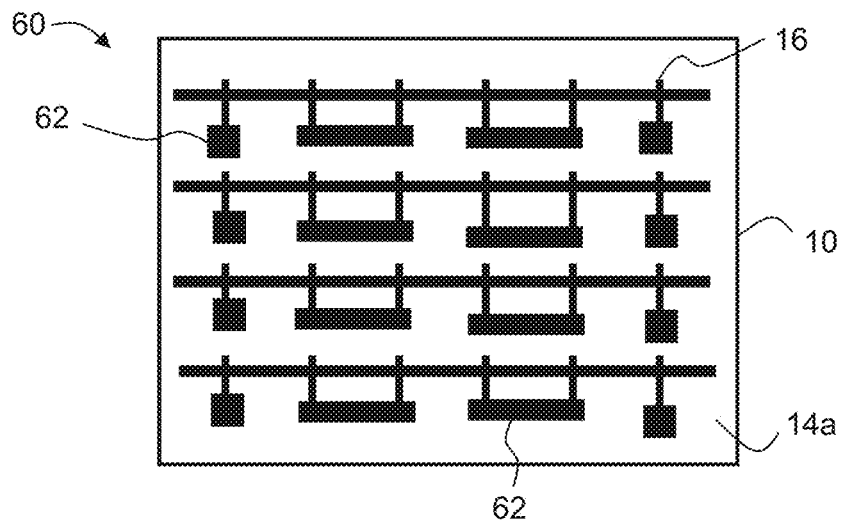

FIG. 9 is a schematic illustration of a circuitry system, e.g., a circuit board, according to some exemplary embodiments of the present invention.

Figure 10:
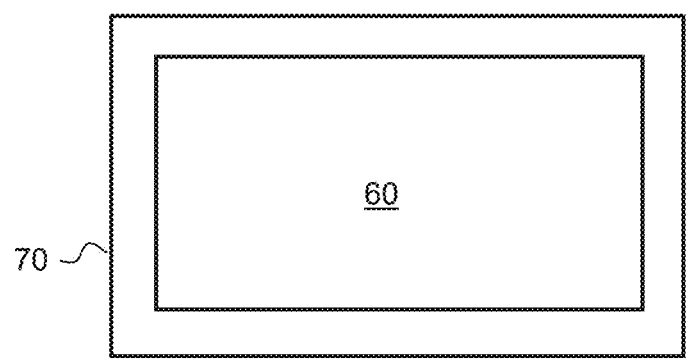

FIG. 10 is a schematic illustration of an appliance which includes the circuitry system of FIG. 9.

Figure 11:
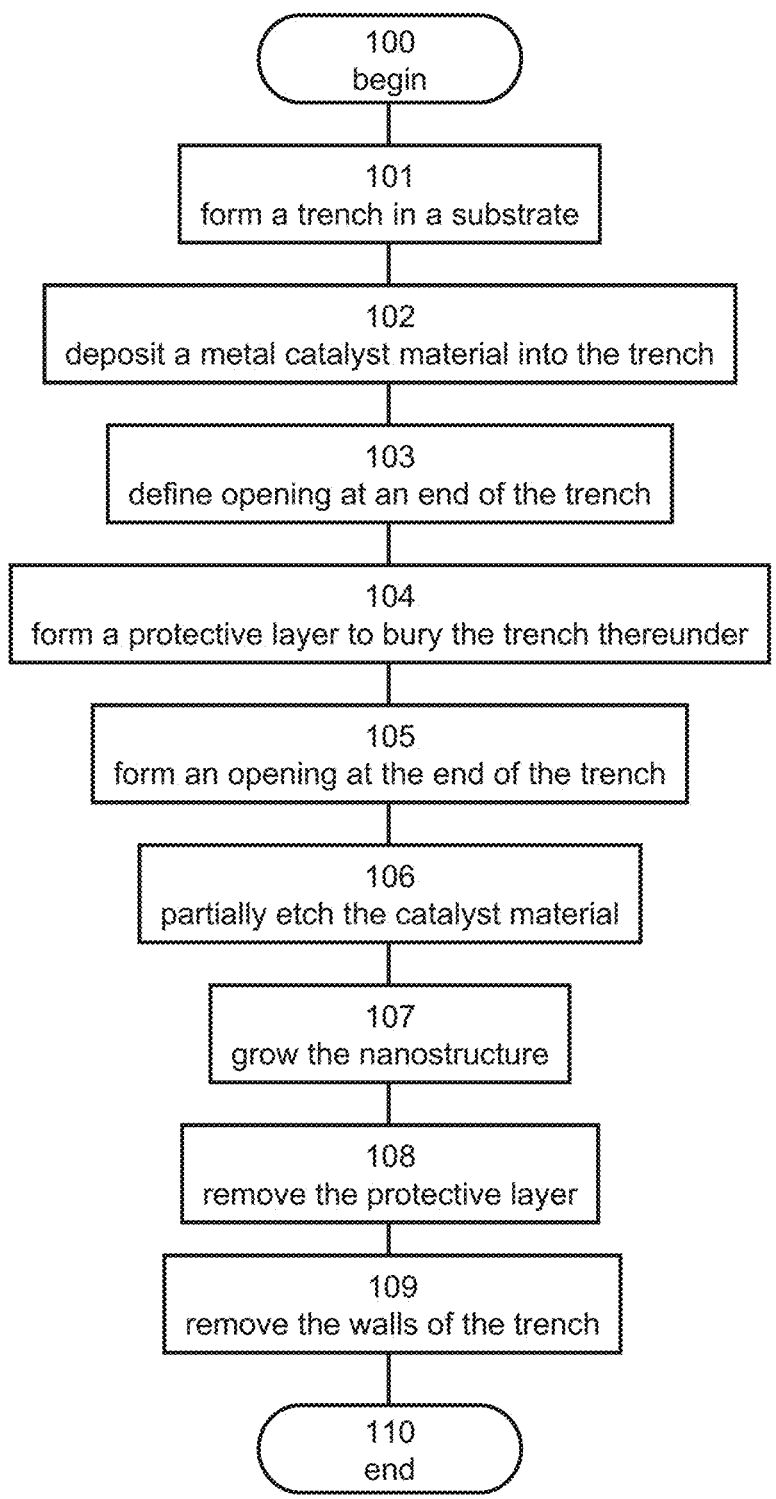
Figure 12A:
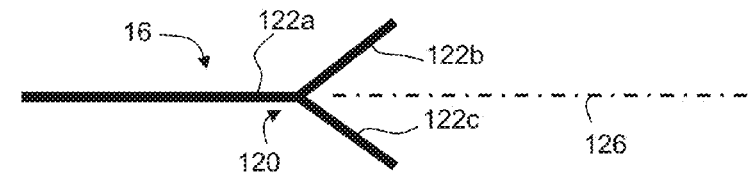
Figure 12B:
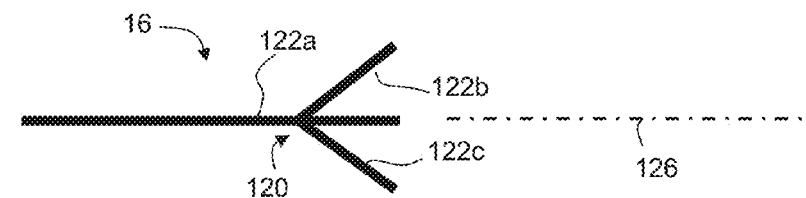
Figure 12C:
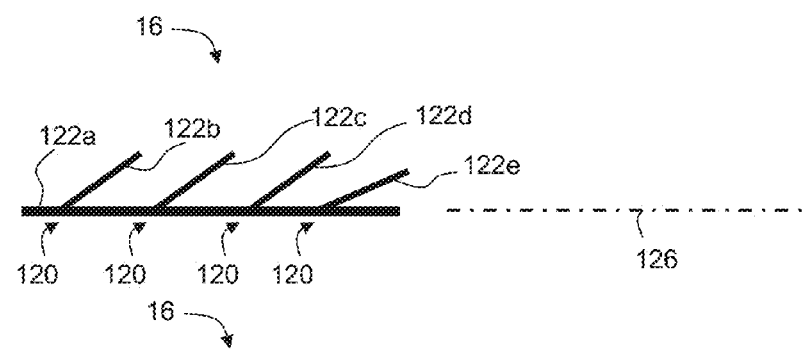
Figure 12D:
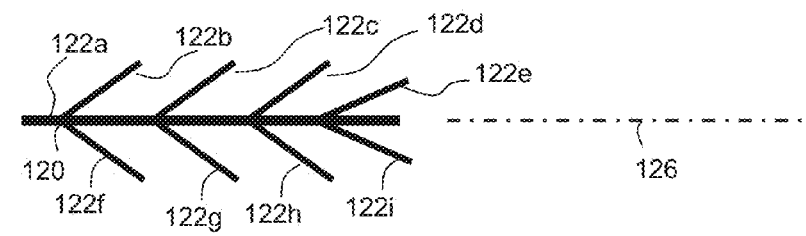
Figure 12E:
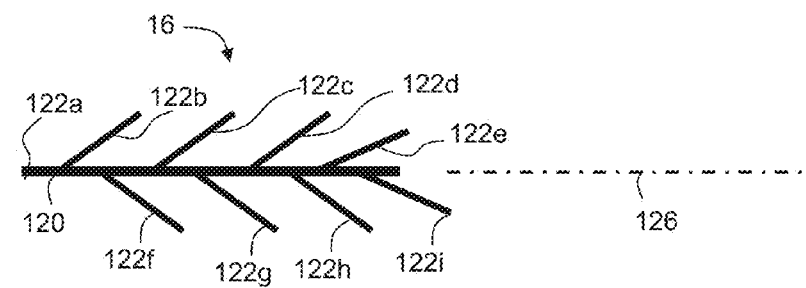

FIG. 11 is a flowchart diagram describing a process suitable for fabricating a nanostructure, according to some embodiments of the present invention.

FIGS. 12A-E are schematic illustrations of nanostructures having branched shapes, according to some embodiments of the present invention.

Figure 13A:
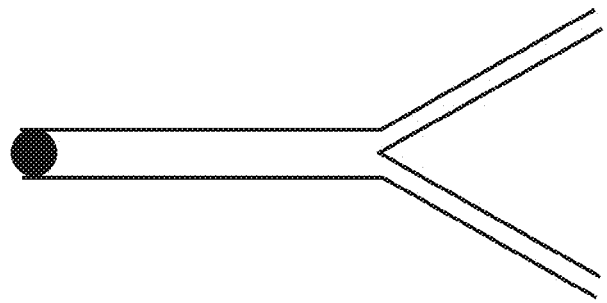
Figure 13B:
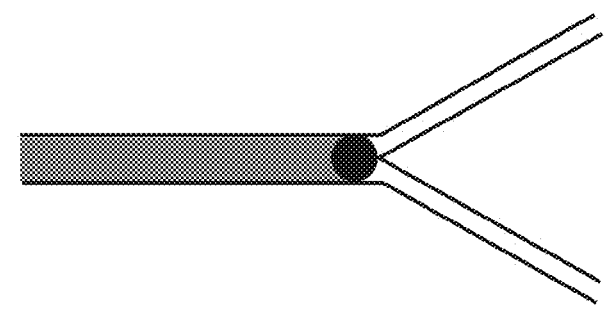
Figure 13C:
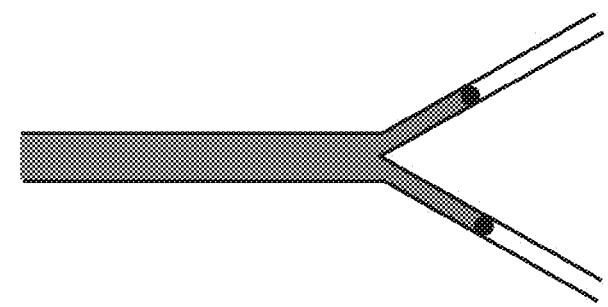

FIGS. 13A-C are schematic illustrations showing a growth process of a branched nanostructure, according to some embodiments of the present invention.

FIGS. 14A-D are schematic illustrations showing a growth process of a crossbar array, according to some embodiments of the present invention.

DESCRIPTION OF SPECIFIC EMBODIMENTS OF THE INVENTION

The present invention, in some embodiments thereof, relates to nanotechnology and, more particularly, but not exclusively, to a nanostructure, a process of producing same and a system containing and utilizing same.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

According to an aspect of some embodiments of the present invention there is provided a process of fabricating a nanostructure, the process being effected by growing the nanostructure in situ within a trench formed in a substrate and having therein (in the trench) a metal catalyst selected for catalyzing said growth, under the conditions that the direction of growth is generally parallel to opposing major surfaces of said substrate.

Referring now to the drawings, FIGS. 1A-K present a schematic illustration of an exemplary process of producing a nanostructure, according to some embodiments of the present invention, and FIGS. 2-7 present some of the characteristic properties of nanostructures produced by this process.

According to an aspect of some embodiments of the present invention there is provided a nanostructure system, comprising a substrate and a nanostructure fabricated by the herein disclosed process.

According to an aspect of some embodiments of the present invention there is provided a nanostructure system, comprising:

a substrate having a first major surface and a second major surface; and a nanostructure embedded within said first major surface, generally parallel thereto and generally flush therewith.

Figure 8A:
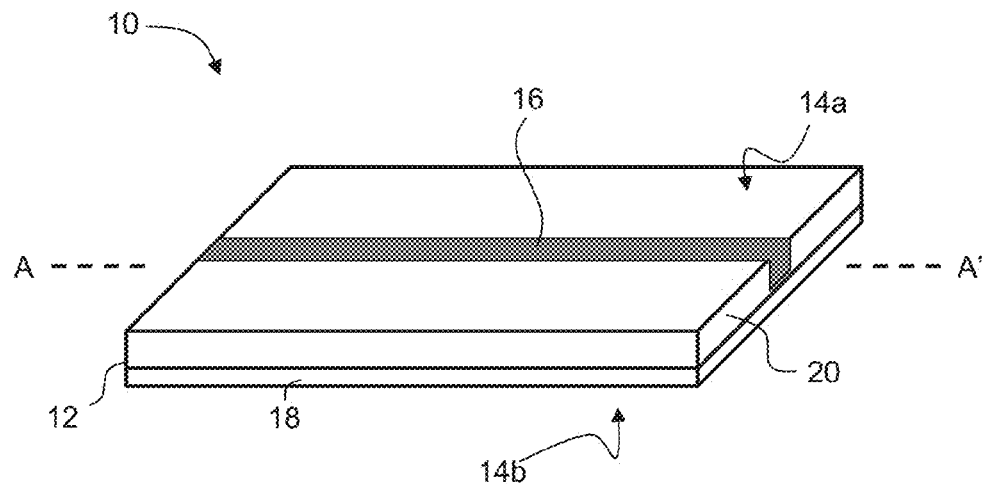
Figure 8B:
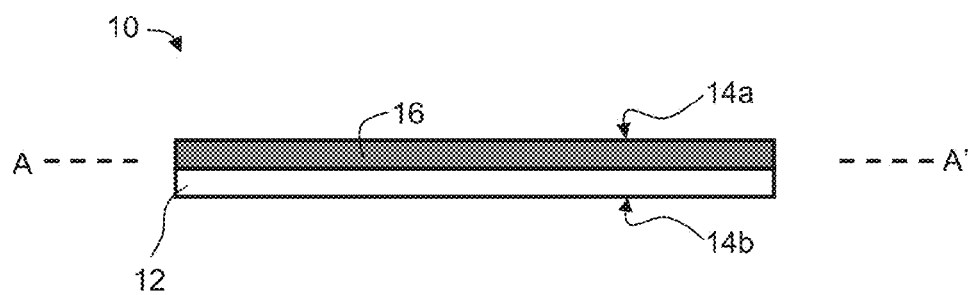

FIGS. 8A and 8B are schematic illustrations of a perspective view (FIG. 8A) and a cross-sectional view along line A-A' (FIG. 8B) of a nanostructure system 10, according to some embodiments of the present invention. System 10 comprises a substrate 12 having a first major surface 14a and a second major surface 14b. In various exemplary embodiments of the invention substrate 12 is generally planar. The substrate can be rigid or flexible, as desired.

As used herein, "major surface" specifies a larger area surface of an object as distinguished from an edge of the object which has a smaller area surface.

In various exemplary embodiments of the invention the area of the major surface is at least 10 or at least 100 or at least 1000 times larger than the area of any of the edges. In some embodiments of the present invention the width-to-thickness and length-to-thickness aspect ratios of substrate 12 are both above 10 or above 50 or above 100.

Substrate 12 can be made of any material suitable for forming trenches and growth of nanostructures therein. Suitable materials for substrate 12 include, without limitation, silicon (e.g., silicon wafers), GaN, InP, GaAs, InGaP, $Si_3N_4$, $Al_2O_3$, ZnO, $ZrO_2$, plastics (e.g., kapton films), quartz and other glass surfaces, polymers and copolymers, and any combination of the foregoing.

In some embodiments of the present invention substrate 12 comprises at least a base layer 18 and an additional layer 20. In some embodiments of the present invention additional layer 20 is a top layer of substrate 12. Layer 20 can be adjacent to base layer 18. Also contemplated are embodiments in which one or more intermediate layers (not shown) are between layers 18 and 20.

In some embodiments, base layer 18 is selected in accordance with the application for which the nanostructure is to be utilized.

In some embodiments, additional layer 20 is selected suitable for performing the embedded nanostructure therein, in accordance with embodiments of the process, as described herein. In some embodiments, additional layer 20 is selected capable of being trenched.

In some embodiments, base layer 18 and additional layer 20 are selected such that additional layer 20 can be selectively removed, without affecting base layer 18. In some embodiments, such a selective removal of additional layer 20 exposes the nanostructures and/or results in nanostructures on top of base layer 18. The nanostructures thus form a relief pattern over the exposed surface of base layer 18.

Thus, in some embodiments, additional layer 20 is a sacrificial layer.

Suitable materials for base layer 18 and additional layer 20 include, without limitation, silicon and silicon oxide, respectively, silicon and silicon nitride, respectively, a glass or quartz surface and silicon nitride, respectively, a plastic and a polymer, respectively.

The overall thickness of substrate 12 can be from several tens of nanometers to several millimeters. Typically, but not necessarily the thickness of each of base layer 18 and additional layer 20 is below 1 micron.

In some embodiments of the present invention system 10 comprises one or more nanostructures 16 embedded within the first major surface 14a. In some embodiments of the present invention at least some of the nanostructures are not embedded, but rather form a relief pattern above the base layer of substrate 12.

Typically, but not necessarily, nanostructure 16 is embedded in additional layer 20 of substrate 12.

As used herein, "embedded" refers to a positional relation in which a guest object (a nanostructure in the present case) is at least partially enclosed by walls formed in a host object (a planar substrate in the present case) such that the guest object is in contact with the walls, wherein the walls are all made of the same material composition.

The term "at least partially enclosed" as used herein refers means that at least two sides of the embedded object (e.g., the left side and bottom, the right side and bottom) contact the walls of the host. Preferably, but not necessarily, at least three sides of the embedded object (e.g., left side, right side and bottom) contact the walls of the host.

A representative example of a guest object embedded in a host object is a configuration in which the guest object is fully or partially submerged below the surface of the host object, e.g., when the guest object lies within a trench formed in the host object.

The term "embedded" excludes a relation in which the guest object is placed on the surface of the host object and is therefore not enclosed or partially enclosed by the host object. The term "embedded" also excludes a relation in which the guest object is enclosed or partially enclosed by different objects with different material compositions such that each of these different objects contacts one side of the guest object but does not contact any additional side thereof.

In some embodiments of the invention nanostructure 16 is generally parallel (e.g., with a deviation of less than 10° from parallelism) to surface 14a. In some embodiments of the invention nanostructure 16 is generally flush with surface 14a (e.g., with a planar misalignment of less than 5 nm). Also contemplated, are embodiments in which at least part of nanostructure 16 is not parallel to surface 14a. In these embodiments nanostructure 16 can span across multiple planes within substrate 12.

In the schematic illustrations of FIGS. 7A and 7B, only one nanostructure 16 is illustrated. However, this need not necessarily be the case, since, for some applications, system 10 can comprises a plurality of nanostructures, as further detailed hereinunder.

Further, although nanostructure 16 is shown in FIGS. 7A and 7B as having the shape of a straight line, this need not necessarily be the case. The nanostructure of the present embodiments can be of any shape. Typically, the nanostructure is elongated.

The term "elongated nanostructure" generally refers to a three-dimensional body made of a solid substance, in which one of its dimensions is at least 2 times, or at least 10 times, or at least 50 times e.g., at least 100 times larger than any of the other two dimensions. The largest dimension of the elongated solid structure is referred to herein as the longitudinal dimension or the length of the nanostructure, and the other two dimensions are referred to herein as the transverse dimensions. The largest of the transverse dimensions is referred to herein as the diameter or width of the elongated nanostructure. The ratio between the length and the width of the nanostructure is known as the aspect ratio of the nanostructure.

In some embodiments of the present invention the elongated nanostructure has, at any point along its length, at least one cross-sectional dimension and, in some embodiments, two orthogonal cross-sectional dimensions less than 1 micron, or less than 500 nanometers, or less than 200 nanometers, or less than 150 nanometers, or less than 100 nanometers, or even less than 70, less than 50 nanometers, less than 20 nanometers, less than 10 nanometers, or less than 5 nanometers. In some embodiments, the cross-sectional dimension can be less than 2 nanometers or 1 nanometer.

In some embodiments, the elongated nanostructure has at least one cross-sectional dimension ranging from 0.5 nanometers to 200 nanometers, or from 1 nm to 100 nm, or from 1 nm to 50 nm.

The length of an elongated nanostructure expresses its elongation extent generally perpendicularly to its cross-section. According to some embodiments of the present invention the length of the nanostructure ranges from 10 nm to 50 microns. In various exemplary embodiments of the invention the length of the elongated nanostructure is at least 100 nm, or at least 500 nm, or at least 1 µm, or at least 2 µm, or at least 3 µm, e.g., about 4 µm, or more.

The cross-section of the elongated semiconductor may have any arbitrary shape, including, but not limited to, circular, square, rectangular, triangular and elliptical. Regular and irregular shapes are included.

The width of the elongated nanostructure is preferably less than 1 µm. In various exemplary embodiments of the invention the width of the nanostructure is from about 5 nm to about 200 nm, more preferably from about 5 nm to about 100 nm.

In various exemplary embodiments of the invention the nanostructure is a non-hollow structure, referred to herein as "nanowire".

In some embodiments of the present invention the elongated nanostructure is a nanoribbon.

As used herein, "nanoribbon" refers to an elongated nanostructures having a cross-sectional aspect ratio above 1 or above 2 or above 3 or above 4 or above 5 or above 10 or above 20 or above 50 or above 100.

In some embodiments of the present invention the nanostructure is made, at least in part, from an electrically conductive material, and in some embodiments of the present invention the nanowire is made, at least in part from a semiconductor material.

In some embodiments, the nanostructure has an average diameter that ranges from 0.5 nanometers to 200 nanometers, or from 1 nm to 100 nm, or from 1 nm to 50 nm.

In some embodiments of the present invention the nanostructure (e.g., a nanowire and/or a nanoribbon) comprises or is made of a semiconductor material.

Exemplary semiconductor materials that are suitable for use in embodiments of the invention include, but are not limited to, silicon (Si), germanium (Ge), gallium nitride (GaN), titanium (Ti), bismuth (Bi), tellurium (Te), lead (Pb), silicon carbide (SiC), gallium arsenide (GaAs), gallium phosphide (GaP), indium phosphide (InP), indium arsenide (InAs), aluminum nitride (AlN), zinc oxide (ZnO), zinc sulfide (ZnS), indium oxide (InO), indium tin oxide (ITO) and cadmium sulfide (CdS).

Figure 8C:
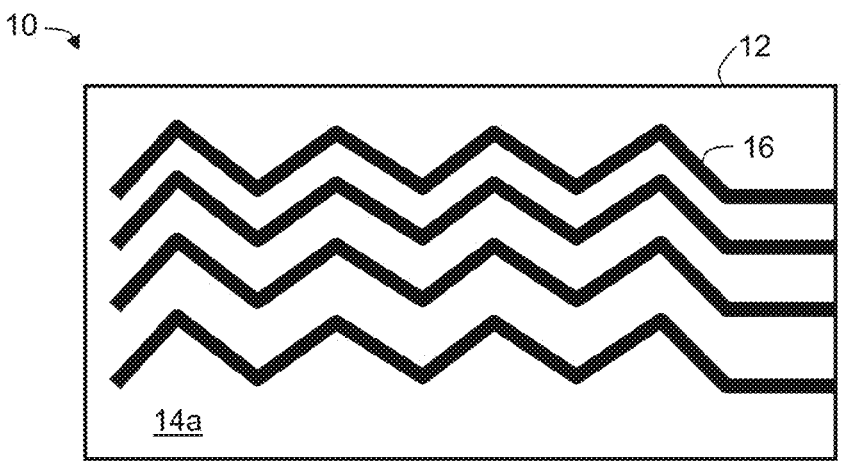

Representative examples of shapes that the elongated nanostructure (e.g., a nanowire and/or a nanoribbon) optionally and preferably can assume include, without limitation, a shape describing a straight line (either parallel or non-parallel to first major surface 14a), a shape describing a wavy line (e.g., a zigzag line, a sinusoidal line, a square wave line, a saw-tooth line), a shape describing a curvilinear line, a shape describing a spiral line, a shape describing a serpentine line, a shape describing a cycloid and any combination thereof. An exemplary shape of the elongated nanostructure according to some embodiments of the present invention is illustrated in FIG. 8C. The elongated nanostructure can also have a non-planar shape. For example, nanostructure 16 can has the shape of a space curve, such as, but not limited to, a space arc, a space wavy line, a helix and the like.

As used herein, terms prefixed by the word "space" (e.g., "space curve," "space arc," "space wavy line") refer to shapes spanning over multiple planes.

Also contemplated are embodiments in which the elongated nanostructure (e.g., a nanowire and/or a nanoribbon) has a branched shape. Representative and examples of branched shapes, which are not to be considered as limiting, are illustrated in FIGS. 12A-E. Generally, a branched nanostructure has at least one branching point 120 (only a few are designated in FIGS. 12A-E, for clarity of presentation), at which three or more elongated sections 122 intersect with each other. The intersected sections are designated in FIGS. 12A-E by reference signs 122a, 122b, 122c, etc. Typically, but not necessarily, the angle between two intersecting sections is other than 90°. Shown in FIGS. 12A-E are shapes having a single branching point with three intersecting sections, namely a Y shape (FIG. 12A), and four intersecting sections (FIG. 12B), but other numbers of intersecting sections at a single branch point are not excluded from the scope of the present invention. Also shown are branched nanostructures having several branching points, e.g., a single sided tree shape (a comb shape) wherein at each branching point there are three intersecting sections at the same side of a longitudinal axis 126 of nanostructure 16 (FIG. 12C), and a double sided tree shape (FIGS. 12D and 12E) wherein the intersecting sections are at both sides of a longitudinal axis 126, with three (FIG. 12E) and four (FIG. 12D) intersecting sections at each branching point. Combinations of these shapes (e.g., a shape in which each of two or more breaching points has a different number of intersecting sections) are not excluded from the scope of the present invention. Also contemplated are curved branched shapes having at least one curved section, and non-planar branched shapes having at least one section having the shape of a space curve.

In some embodiments, nanostructure 16 comprises at least one kink or at least two kinks or at least two kinks or at least three kinks or more kinks (e.g., 4, 5, 6, 7, 8, 9, 10 or more).

As used herein, a "kink" is a relatively sharp transition or turning between a first substantially straight portion of an elongated nanostructure and a second substantially straight portion of the elongated nanostructure. The transition may be defined by a transition region linearly defined along the length of the elongated nanostructure, where the region has a maximum linear length that is less than about 5% of the linear length of the average of the first and second substantially straight portion of the regions immediately surrounding the transition region. In some cases, the transition region may have a linear length that is less than about 5%, or less than about 3%, or less than about 1%, or less than about 0.5%, or less than about 0.3%, or less than about 0.1%, or less than about 0.03%, or less than about 0.01% of the linear length of the substantially straight portions surrounding the transition region. Several examples of kinks are provided in the Examples section that follows.

The kink(s) may define any angle. For example, the kink can have any angle from about 30° to about 150°. In some embodiments of the present invention the kink defines an angle less than 115° and in some embodiments of the present invention the kink defines an angle above 125°.

In some embodiments of the present invention nanostructure 16 has a substantially uniform crystallinity.

The uniformity of the crystallinity is a measurable quantity. A representative procedure for measuring the uniformity of the crystallinity is by means of crystallographic analysis. A crystallographic measurement can be performed to determine the crystallographic orientation of various segments of the nanostructure, and the uniformity can be determined based on the number of different crystallographic orientations observed. Specifically, for a large number of different crystallographic orientations per unit length the uniformity is low, and for a small number of different crystallographic orientations per unit length the uniformity is low.

The term "crystallographic orientation" refers to the unit cell characteristics of a crystalline material.

An elongated nanostructures has "a predominately uniform crystallinity" if more than 50 length percent of the nanostructure has the same crystallographic orientation; "a substantially uniform crystallinity" if at least 90 length percent of the nanostructure has the same crystallographic orientation; and "an essentially uniform crystallinity" if at least 95 length percent of the nanostructure has the same crystallographic orientation. The crystallinity of a nanostructure is said to be "entirely uniform" if there is no detectable crystallographic orientation other than the stated crystallographic orientation.

Those of ordinary skill in the art will be able to determine the crystallographic orientation of an elongated nanostructure, or a segment thereof, using routine techniques such as lattice-resolved TEM images or selected area electron diffraction (SAED) patterns or electron backscattered diffraction (EBSD) using the nanostructure.

In some exemplary embodiments of the invention, nanostructure 16 consists essentially of a single crystallographic orientation throughout its length. When nanostructure 16 comprises one or more kinks, the crystallographic orientation at the non-kinked section can be different from the crystallographic orientation at the kinks themselves.

In some embodiments, nanostructure 16 has one or more kinks defining an angle less than 115° or above 125°, and consists essentially of a single crystallographic orientation throughout its length. In some embodiments, nanostructure 16 has one or more kinks defining an angle less than 115° or above 125°, wherein the crystallographic orientation at the non-kinked section can be different from the crystallographic orientation at the kinks themselves.

In some embodiments of the present invention nanostructure 16 has a non-uniform crystallinity. In these embodiments, at most 50 length percent (e.g., 40 percent or 30 percent or less) of the nanostructure has the same crystallographic orientation. For example, the crystallographic orientation of nanostructure 16 can gradually vary along its length. When nanostructure 16 comprises one or more kinks, the crystallographic orientation at the kink can be different from the crystallographic orientation at one or more regions adjacent to the kink.

In some embodiments, nanostructure 16 has one or more kinks defining an angle less than 115° or above 125°, and also has a non-uniform crystallinity. In some embodiments, nanostructure 16 has one or more kinks defining an angle from about 115° to about 125°, and also has a non-uniform crystallinity.

Figure 8D:
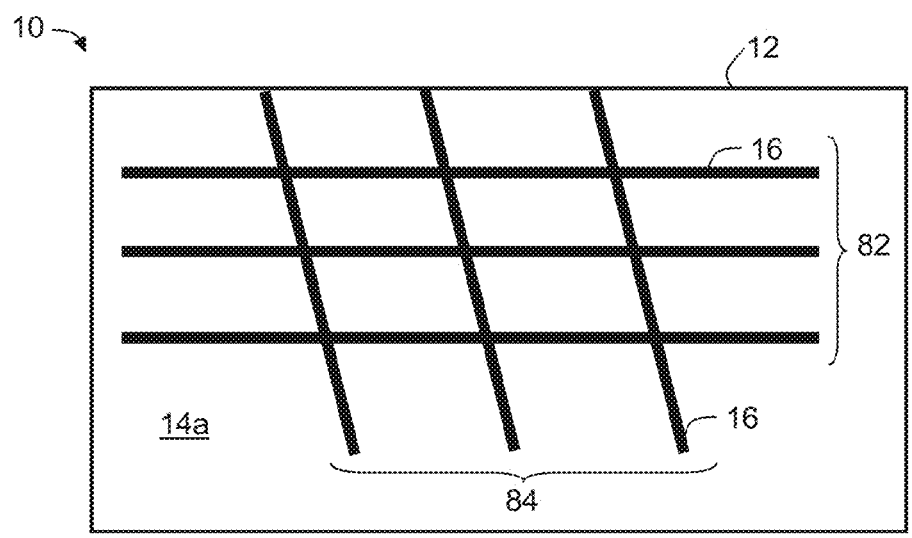
Figure 8E:
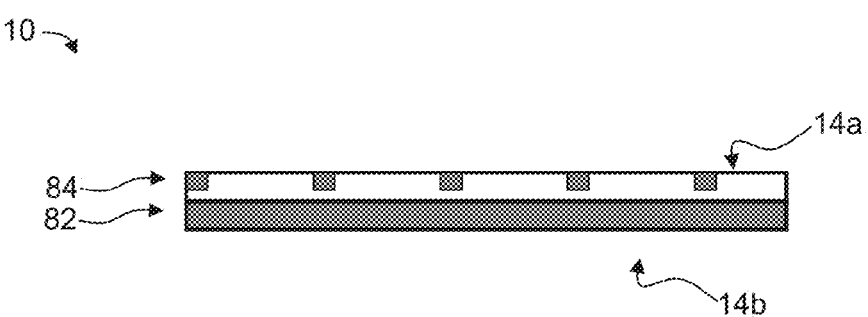

FIG. 8C is a schematic illustration of a top view of system 10 in embodiments of the present invention in which substrate 12 is formed with more than one nanostructure 16. System 10 can include any number of nanostructures. In some embodiments of the present invention, the number of nanostructures in system at least 10 or at least 100 or at least 1,000 or at least 10,000 nanostructures or at least 100,000 nanostructures or at least 1,000,000 nanostructures. The total area occupied by the nanostructure array can be above 1 cm² or above 2 cm² or above 4 cm² or above 8 cm² or above 10 cm² or above 50 cm² or above 100 cm². The distance between two nanostructures can be less than 100 nm, or less than 80 nm or less than 60 nm, e.g., 50 nm or less. The nanostructures can be arranged in any arrangement. In the illustration of FIG. 8C, the nanostructures are arranged such that their respective sections are generally parallel to each other. However, this need not necessarily be the case, since, for some applications, it may not be necessary for the nanostructures to be parallel to each other. For example, in some embodiments of the present invention, the nanostructures form a crossbar array in substrate 12, these embodiments are illustrated in FIG. 8D, showing a first group of nanostructures 82 crossing a second group of nanostructures 84. Groups 82 and 84 can cross each other at any angle. The nanostructures in the crossbar array can be straight or they can have any other shape, such as the shapes described hereinabove. Two nanostructures crossing each other in a crossbar array preferably engage different planes. A typical side view of such an arrangement is illustrated in FIG. 8, showing first group 82 (only one nanostructure of this group is visible from this viewpoint) engaging a lower plane and second group 84 (the cross-section of this group is visible from this viewpoint) engaging a second plane, which may be generally parallel and separated from the first plane. Although not shown in FIG. 8D, one or more of the nanostructures in group 82 can contact one or more of the nanostructures in group 84. Alternatively the two groups can be spaced apart from each other. Also contemplated are arrangements in which there are more than three groups of nanostructures, each engaging a different plane.

The present embodiments contemplate many uses for system 10.

System 10 can be incorporated in many nanowire-based electronic devices, including, without limitation, nanoelectronic detection device, transparent circuit boards, field emission cathodes, display devices, light emitting devices, transistors, diodes, memory media, sensors, switches and the like. For example, in some embodiments, system 10 is combined with electrodes, e.g., to form a transistor, such as a field effect transistor (FET). Such transistors can be used in integrated circuits, serving as components in, for example, logic gates, switches and other digital electronics components. System 10 can also be configured with an electrical circuit. For example, in some embodiments, the nanostructure (e.g., a nanowire and/or a nanoribbon) is connected to an AC or DC power source. In some embodiments, a device that includes a substrate on which is disposed a plurality of nanostructures (e.g., nanowires and/or nanoribbons) is fabricated.

Reference is now made to FIG. 9 which is a schematic illustration of a circuitry system, e.g., a circuit board, according to various exemplary embodiments of the present invention. Circuit board 60 comprises system 10 and a plurality of additional components 62, such as, but not limited to, electrodes, semiconductor elements and contact pads. The additional electronic components can be of microscopic and/or millimetric size as desired, and they are typically deposited on the planar surface such that at least some of the nanostructures contact one or more of these components. In some embodiments of the present invention there is at least one additional component which contacts more than one nanostructure.

Circuit board 60 can be manufactured by depositing a plurality of additional electronic components on system 10.

FIG. 10 is a schematic illustration of an appliance 70 which includes circuitry 60. Appliance 70 is typically, but not necessarily, a large area electronic appliance. Representative examples of appliances suitable for the present embodiments include, without limitation, a diode, a transistor (e.g., a field effect transistor), an optoelectronic system (e.g., a spatial imaging system, an optical computing system, an optical logic gate, an optoelectronic switch, a light emitting diode, a light detector, a photonic A/D converter, etc.), a display system (e.g., an active matrix display system), a projector display system, a sensor (e.g., an electrochemical sensor or a biosensor), an identification tag, a memory medium, a smart card (e.g., a microprocessor card, cryptographic card, ATM card, subscriber identity module card also known as SIM card), and a projector display.

It is expected that during the life of a patent maturing from this application many relevant electronic appliances, particularly in the field of large area electronics will be developed and the scope of the term "appliance" is intended to include all such new technologies a priori.

In some embodiments, system 10 can be used for the analysis of an analyte. The analyte can be positioned in relation to the nanostructure of system 10 such that the analyte can be determined by determining a change in a characteristic of the nanostructure.

System 10 can thus be used for the detection of chemicals such as explosives and other hazardous chemicals, drugs, and the like, and of biological moieties such as cells, proteins, nucleic acids, carbohydrates, saccharides, lipids, antibodies, or other biological entities. In some embodiments, the nanostructure of system 10 is surface-functionalized. Surface-functionalization may be achieved, in some embodiments, by coating at least a portion of the nanostructure (e.g., with a shell). In some embodiments, at least a portion of the nanostructure is functionalized by performing a chemical reaction on the surface of the nanostructure. Surface-functionalization can comprise attaching a functional moiety to the surface of the nanostructure. In some embodiments, a functional moiety may be attached directly to the surface of the nanostructure (i.e., through a chemical bond). In another embodiment, the functional moiety may be attached to a coating on the nanostructure.

The functional moieties may include simple functional groups, for example, but not limited to, $-OH$, $-CHO$, $-COOH$, $-SO_3H$, $-CN$, $-NH_2$, $-SH$, $-CO_2H$, COOR, or a halide; such groups can be generated on the nanostructure surface or attached to the nanostructure surface via a linker. For example, intrinsic reactive moieties on the nanostructure surface (e.g., hydroxy groups of a silicon nanostructure) can be used for reacting with an alkylsilicate or an arylsilicate that terminates with the desired functional group, via formation of $-Si-O-$ bonds. Optionally, the functional group can be a biomolecular entity including, but not limited to, amino acids, proteins, sugars, DNA, antibodies, antigens, and enzymes; grafted polymer chains with chain length less than the diameter of the nanoscale wire core, including, but not limited to, polyamide, polyester, polyimide, polyacrylic; a thin coating (e.g., shell), covering the surface of the nanostructure core, including, but not limited to, the following groups of materials: metals, semiconductors, and insulators, which may be a metallic element, an oxide, an sulfide, a nitride, a selenide, a polymer and a polymer gel.

Following is a description of process suitable for fabricating a nanostructure (e.g., a nanowire and/or a nanoribbon), according to some embodiments of the present invention. The process is particularly useful for fabricating nanostructure(s) 16 of system 10 in situ. Generally, the nanostructure (e.g., a nanowire and/or a nanoribbon) is grown within a trench formed in the substrate. The trench has therein a metal catalyst which catalyzes the growth of the nanostructure. Thus, the growth of the nanostructure is guided by the trench. In various exemplary embodiments of the invention the nanostructure grows under the conditions that the direction of growth is generally parallel to opposing major surfaces of the substrate. In various exemplary embodiments of the invention the trench is at least partially buried within the substrate under a protective layer (a capping layer) which covers one of the major surfaces, and the growth of the nanostructures occurs within the buried trench and being guided by the trench. In some embodiments, the process places the metal catalyst in the trench, and optionally also forms the trench in the substrate. The process optionally and preferably also forms the protective layer over the trench.

Before providing a further detailed description of the process, as delineated hereinabove and in accordance with some embodiments of the present invention, attention will be given to the advantages and potential applications offered thereby.

The present inventors have demonstrated a simple and robust confinement-guided nanowire growth process that enables to pre-design not only the chemical and physical attributes of the synthesized nanostructures, but also allows controlling their geometry. The process optionally and preferably allows the synthesis of various types of nanostructures, such as, but not limited to, nanowires and nanoribbons, in a wide variety of shapes as further detailed hereinabove. The process of the present embodiments also allows controlling the density and number of nanostructures.

The process of the present embodiments is suitable for fabricating nanostructures from a variety of nanostructure materials in or on a variety of substrate materials.

The present inventors showed that the process of the present embodiments is useful for fabricating a nanostructure wherein the growth direction of the nanostructure is controlled for any crystallographic orientation. The present inventors found that when a nanostructure is grown within a trench, the direction of the growth is controlled by the direction of the trench, even when this direction differs from the major crystallographic direction. This is advantageous over conventional techniques in which the growth direction (for example, the angle of the kink, in kinked nanostructures) is dictated by the crystallographic orientation and cannot be altered.

Thus, the process of the present embodiments can be used for fabricating a nanostructure having a non-uniform crystallinity or a predominantly uniform crystallinity or a substantially uniform crystallinity or an essentially uniform crystallinity. The present inventors also demonstrated fabrication of a nanostructure having an entirely uniform crystallinity using the process of the present embodiments.

Reference is now made to FIG. 11 which is a flowchart diagram describing a process suitable for fabricating a nanostructure, according to some embodiments of the present invention. The process is particularly useful for fabricating nanostructure(s) 16 of system 10 in situ. Representative illustrations of various process stages in accordance with some embodiments of the present invention are provided in FIGS. 1A-K of the Examples section that follows.

It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The process begins at 100 and, optionally and preferably, continues to 101 at which a trench is formed in a substrate. The type of the substrate is preferably selected in accordance with the application for which the nanostructure is to be utilized and is further selected capable of being trenched. Representative examples of substrates suitable for the present embodiments include, without limitation, silicon (e.g., silicon wafers), GaN, InP, GaAs, InGaP, $Si_3N_4$, $Al_2O_3$, ZnO, $ZrO_2$, plastics (e.g., kapton films), quartz and other glass slides, glass films and other glass surfaces, polymers and copolymers and any combination of the forgoing (e.g., in cases where the substrate comprises a base layer and an additional layer).

Typical depths of the trench include any depth from about 10 nm to about 500 nm. The length of the trench is selected in accordance with the desired length of the nanostructure to be grown. A typical linear distance between a first end of trench and a second end of trench is at least 1 µm or at least 2 µm. For non-straight trenches, the overall length of the trench is longer than the linear distance, and is approximately the same as the desired length of the nanostructure, e.g., at least 1.1 µm or at least 2 µm, or at least 3 µm, e.g., about 4 µm, or more.

Since the trench is used for guiding the growth of the nanostructure, it can have any of the shapes described above with respect to nanostructure 16. Thus, the trench can have a shape describing a straight line, a shape describing a wavy line, a shape describing a curvilinear line, a shape describing a spiral line, a shape describing a serpentine line, a shape describing a cycloid, a shape of describing a space curve, a branched shape, a non-planar branched shape, as further detailed hereinabove, including any combination between two or more of the above or other shapes.

The trench can be formed, for example, by employing a lithography process in which the shape of the trench is patterned on a resist film, followed by an etching process in which the substrate material is etched according to the pattern. A representative and non-limiting example of these processes is shown in FIGS. 1A-C. The lithography and etching processes can generally be selected based on the substrate and resist material. Representative examples of suitable lithography processes include, without limitation, electron beam lithography, and nanoimprint lithography, and representative examples of suitable etching processes include, without limitation, reactive ion etch (RIE), ethylenediamine-pyrocatechol-water (EDP) etch, and Buffer Oxide Etch (BOE), as well as any other etching process which is suitable for etching the substrate and/or, in cases where the substrate consists of two layers, is suitable for selectively etching the desired layer (e.g., the upper layer; see, layer 20 in FIG. 8A). Those skilled in the art will be able to select a suitable etching process and suitable etchants, based on the selected substrate material(s).

In embodiments of the invention in which the trench spans across multiple planes (for example, a planar shape which is slanted with respect to the major surface of the substrate, or a non-planar shape such as a space curve or a non-planar branched shape), the trench is preferably formed by a Focused Ion Beam (FIB) process, as known in the art of micro- and nano-fabrication.

In some embodiments of the present invention the process continues to 102 at which a metal catalyst material is deposited into the trench so at to at least partially fill the trench by the metal catalyst material. In some embodiments of the present invention the deposition of catalyst material is preceded by deposition of an adhesive layer, which is selected to enhance the coupling between the substrate and the catalyst material The metal catalyst material is selected so as to catalyze nanostructure growth, for example, via the vapor-liquid-solid (VLS) mechanism. The type of metal catalyst material typically depends on the nanostructure material. Generally, any metal able to form an alloy with the desired semiconductor material, but does not form a more stable compound than with the elements of the desired semiconductor material may be used as the catalyst material. Representative examples of metal catalyst materials suitable for the present embodiments include, without limitation, gold, silver, copper, zinc, cadmium, iron, nickel and cobalt. Any other material that is recognized as useful as a catalyst for nanostructure growth by the selected technique is also contemplated.

When an adhesive layer is deposited, the material used for forming the adhesive layer is selected such that it is capable of adhering both to the substrate and to the catalyst material. For example, when the catalyst material is gold and the substrate is made of silicon or silicon oxide, the adhesive layer can be made of titanium and/or chromium. In general, any material that is useful for serving as an adhesive of a selected catalyst material and a selected substrate is contemplated. In some embodiments, the material used for forming the adhesive layer is further selected such that it can be selectively removed, if desired, without affecting the structure, shape and composition of the trenches, the trenched substrate, the grown nanostructure and the catalyst layer. Such materials can be readily selected by those skilled in the art, depending on the selected substrate, catalyst material and the other components used in the herein described methodology.

The metal catalyst material can be deposited into the trench by evaporating the metal catalyst material onto the surface of substrate including the trench, and removing the metal catalyst material from the surface, thereby leaving the metal catalyst material only in the trench. The removal can be by a liftoff technique, thereby utilizing the resist employed for the aforementioned lithography process. A representative and non-limiting example of the evaporation and liftoff processes is shown in FIGS. 1D and 1E. Other processes and resists utilized therefore, can be readily selected by those skilled in the art based on the materials used in the described methodology, and are also contemplated.

In some embodiments of the present invention the process continues to 103 at which an opening is defined at the end of the trench. This can be done, for example, by lithography, such as, but not limited to, photolithography or any other lithography process. The definition of the opening typically includes depositing a resist having the shape of the opening at one of the ends of the trench. A representative and non-limiting example of this operation is shown in FIG. 1F. Other processes and resists utilized therefore, can be readily selected by those skilled in the art based on the materials used in the described methodology, and are also contemplated.

The process optionally continues to 104 at which a protective layer is formed on the substrate to cover the surface of the substrate and bury the trench thereunder. The protective layer is also referred to herein as a "capping layer". A suitable process for forming a protective layer is a vapor deposition process, such as, but not limited to, chemical vapor deposition (CVD), e.g., Inductively Coupled Plasma CVD (ICPCVD). Other vapor deposition techniques and layer forming techniques are not excluded from the scope of the present invention. A representative and non-limiting example of this operation is shown in FIG. 1G.

The protective layer can be made of any material which differs from the catalyst material. In some embodiments of the present invention the protective layer is made of the same material which defines the trench on the substrate. In some embodiments, the protective layer is made of a material that is etchable under conditions that do not affect the formed nanostructure(s) and optionally do not affect also the substrate. Representative examples of suitable materials for the protective layer include, without limitation, silicon dioxide, $Si_3N_4$, and $Al_2O_3$. Such protective layers are suitable for use, for example, in cases where the grown nanostructure comprises silicon.

In embodiments in which operation 103 is employed, the process preferably continues to 105 at which the opening at the end of the trench is formed. Typically, this operation includes a liftoff process in which the resist deposited at 103 is removed, thereby forming the opening. The removal of the resist also removes part of the protective layer, thus forming an opening in this layer. A representative and non-limiting example of this operation is shown in FIG. 1H.

At 106 the metal catalyst material that occupies the trench is partially etched so as to maintain a remnant of the metal catalyst material within the trench.

Optionally, the adhesive layer, if present is also etched. Etchings of the catalyst material and/or the adhesive layer can be performed using any suitable etchant (e.g., an etchant for selectively removing the catalyst material, an etchant for selectively removing the adhesive layer and/or an etchant for selectively removing both the catalyst material and the adhesive layer, while maintaining all other components (the substrate, the protective layer, etc., intact). A suitable etchant or a combination of etchants would be readily selected by those skilled in the art, based on the materials used in the herein described methodology.

As a non-limiting example, for a gold catalyst material, any available gold etchant (e.g., gold wet etchant) is used.

As a non-limiting example, for a Ti adhesive layer, a Titanium wet etchant, which is composed of a mixture of 20 parts $H_2O$, 1 part 30% $H_2O_2$ and 1 part 49% HF, is used.

The remnant serves as the catalyst for the growth of the nanostructure, and is preferably located at the closed end of the trench, namely far from the opening formed at 105 (in the embodiments in which such operation is employed). In some embodiments of the present invention the metal catalyst occupies a length of at most 300 nm or at most 280 nm or at most 260 nm or at most 240 nm or at most 220 nm or at most 200 nm or at most 180 nm or at most 160 nm or at most 140 nm or less along the longitudinal direction of the trench.

The partial etching performed at 106 is typically wet etching wherein the etchant is selected in accordance with the type of metal catalyst material. For example, for a gold catalyst, any standard gold etchant is suitable. Since the catalyst material is buried under the protective layer, the etching process is advanced inwardly from the end of the substrate, and the partiality of the process can be ensured by a judicious control of the etching duration. Specifically, the size (occupation length) of the remnant catalyst decreases when the etching duration is increased. The process of the present embodiments thus selects the etching duration in accordance with the desired occupation length of the catalyst, the etching rate and the overall length of the trench. At the end of the selected duration interval the etching process is quenched, thereby ensuring a remnant catalyst having the desired occupation length. The quenching can be by any technique known in the art, such as, but not limited to, immersion in aqueous solution (e.g., deionized water) and the like. A representative and non-limiting example of the effect of partial etching is shown in FIG. 1-I. FIG. 4A is a schematic illustration of the metal catalyst once placed into the trench having a width w and a thickness h.

While the embodiments above were described with a particular emphasis to etching of catalyst which is buried under the protective layer, it is to be understood that more detailed reference to such process is not to be interpreted as limiting the scope of the invention in any way. The metal catalyst can be placed in the trench in other techniques as well. For example, a lithography followed by etching can be employed while the trench is not covered. In an exemplary embodiment, lithography is employed to define a portion of the catalyst material within the trench once the trench is filled or partially filled with the catalyst material, and a subsequent etching process is executed to remove part of the catalyst material.

The process continues to 107 at which the nanostructure is grown in situ within the trench. The growth is typically by the VLS mechanism. To this end, a vapor deposition technique such as a Physical Vapor Deposition (PVD) or a CVD can be employed. CVD can be employed using either a hot-wall or a cold-wall CVD reactor.

Generally, a hot wall reactor employs relatively low pressure (typically, but not necessarily, a few Torrs or less)

and high temperature (typically, but not necessarily, 60° C. or above). A cold wall reactor employs atmospheric pressure and low temperature (typically, but not necessarily, less than 600° C.).

In a representative hot wall reactor the operation constitutes heating a reactor chamber and the substrate to a desired temperature by a heat source, and the desired deposition pressure is set. The reactor chamber is then flooded with a source gas and a small volume of a carrier gas is then input into the reactor chamber in order to set the deposition pressure. The source gas and carrier gas react to form the nanostructure and the resultant gas is vented out.

In a representative cold wall CVD, the substrate is placed on a heating chuck and inserted into a vacuum chamber having induction coils provided on an outside surface thereof. The heating chuck absorbs radiofrequency energy from the induction coils, indirectly heating the substrate. The walls of the vacuum tube are transparent and non-obstructive to radiant heat energy such that the walls do not absorb the radiofrequency energy emitted from the induction coils. Thus, the walls of the vacuum tube are relatively cool and remain well below the reaction temperature.

Other techniques useful for growing the nanostructure include, without limitation, catalytic chemical vapor deposition (C-CVD), organometallic vapor phase deposition (MOCVD), solution phase reactions (e.g., hydrothermal reactions, solvothermal reactions), physical deposition techniques (e.g., thermal evaporation, electron-beam evaporation, laser ablation, molecular beam epitaxy) and surface-controlled chemical reactions.

Suitable materials for use as a growth material for the nanostructure include, without limitation, semiconductor materials such as, but not limited to, silicon (Si), germanium (Ge), gallium nitride (GaN), titanium (Ti), bismuth (Bi), tellurium (Te), lead (Pb), silicon carbide (SiC), gallium arsenide (GaAs), gallium phosphide (GaP), indium phosphide (InP), indium arsenide (InAs), aluminum nitride (AlN), zinc oxide (ZnO), zinc sulfide (ZnS), indium oxide (InO), indium tin oxide (ITO) and cadmium sulfide (CdS).

During the growth process, the nanostructure material reacts with the catalyst, diffuses, past the catalyst, towards the closed end of the trench, thereby gradually biasing the catalyst outwardly. The growth direction is, therefore, from the closed end of the trench outwardly. The growth of nanostructure within the trench is preferably continues until the nanostructure occupies the trench by its entirety. A representative and non-limiting example of the effect of this process is shown in FIG. 1J.

When the trench is branched, the growth is preferably initiated at a non-branched end of the trench such that when the catalyst arrives at a branch point, it is separated into several parts each entering one of the intersected sections that exit from the branching point. In these embodiments, the growth conditions are preferably such that the catalyst is in liquid form. The growth process, for the exemplified case of a Y-shape trench is illustrated in FIGS. 13A-C. FIG. 13A shows the catalyst at the end of the trench, before the initiation of the growth process. Once the growth process begins, the nanostructure grows within the trench and pushes the catalyst forward in the growth direction. FIG. 13B shows the position of the catalyst once the grown nanostructures has pushed it until the branching point of the trench. As the growth process continues, the bias force of the nanostructures against the catalyst effects a separation of the catalyst into several parts (two, in the present example) each entering a different the trench section that exits the branching point. The nanostructure thus continues to growth within each such section, as illustrated in FIG. 13C.

In various exemplary embodiments of the invention the process continues to 108 at which the protective layer is removed so as to expose nanostructure. This can be done, for example, by etching, such as, but not limited to, RIE.

In some embodiments of the present invention the process continues to 109 at which the walls of the trench(es) are removed, such that the nanostructure(s) form a relief pattern over the base layer of the substrate. The walls of the trench can be removed, for example, by removing (e.g., by etching using a suitable etchant) the layer of substrate in which the trenches are formed (e.g., layer 20, see FIG. 8A).

In some embodiments, the process ends at 110.

The process of the present embodiments can be executed for forming a single nanostructure (e.g., a nanowire and/or a nanoribbon) embedded in the substrate or, more preferably, a plurality of embedded nanostructures. The process of the present embodiments can be executed for fabricating one or more nanostructures forming a relief pattern over the exposed surface of the substrate.

When more than one nanostructure is fabricated, the substrate is formed with a plurality of trenches, each having a metal catalyst therein, and each nanostructure is grown in one trench. The growth of all nanostructures can be simultaneous. For example, a substrate with a plurality of trenches with catalysts can be placed in a CVD reactor so as to grow all nanostructures in a single CVD batch. Other operations of the process can also be performed generally simultaneously. For example, for the formation 101 of the trenches, the lithography is employed to pattern the substrate with a plurality of trenches (e.g., parallel, non-parallel, intersecting), and the etching process results in a plurality of trenches formed on the substrate. Similarly, each of operations 102-108 can be executed simultaneously to all nanostructures, e.g., as illustrated in FIGS. 1D-K. Also contemplated are embodiments in which one or more of operations 102-108 is performed sequentially.

In some embodiments of the invention the plurality of trenches are constructed such that once the nanostructures are grown, they form a crossbar array. These embodiments will now be explained with reference to FIGS. 14A-D. The description is for an embodiments in which the formed crossbar array comprises two groups of straight nanostructures, but one of ordinary skills in the art, provided with the details described herein would know how to adjust the process of the present invention for other arrangements (e.g., more than two groups, non-straight nanostructures, etc.).

Figure 14A:
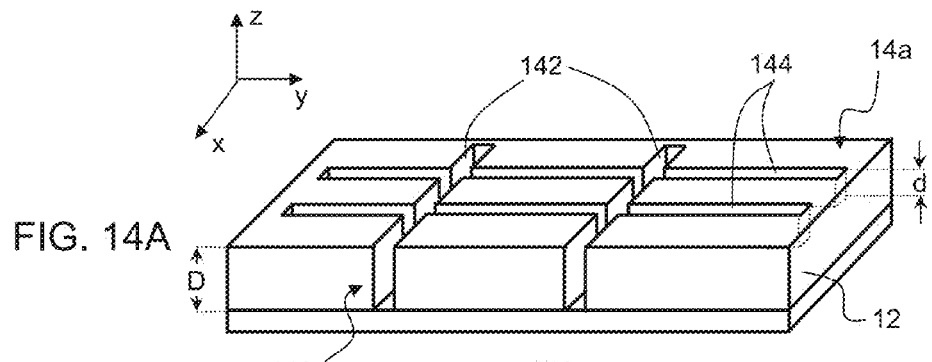

FIG. 14A illustrates substrate 12 following the formation of a plurality of trenches, and depositing a catalyst in each trench. Substrate 12 is shown together with a Cartesian coordinate system defined such that the x-y plane is parallel to the major surfaces of the substrate. Two groups of trenches are shown, group 142 align along the x direction and group 144 along the y axis. While FIGS. 14A-D illustrate two trenches in each group it is to be understood that each group can include any number of trenches (inclosing the case of a single trench for any of groups 142 and 144. Trenches 142 and 144 have different depths. In the representative illustration of FIG. 14A, the depths D (along the z axis) of trenches 142 is larger than the depth d of trenches 144. Typically, D can be 1.1-3 times larger than d, where d is from about 10 nm to about 500 nm.

As shown, openings are formed at the ends of trenches 142 but not at the ends of trenches 144. The openings are generally shown at 146. The catalyst is located at a closed end of each trench, and the trenches are buried under a protective layer formed over the major surface 14a of substrate 12. For clarity of presentation, the protective layer and the catalyst are not shown. The process for forming the trenches, protective layers, and openings, and for introducing the catalyst into the trenches is generally the same as detailed hereinabove. For example, operations 101 through 106, or some of these operations, can be executed, with the exception that the ends of trenches 144 remain close.

Figure 14B:
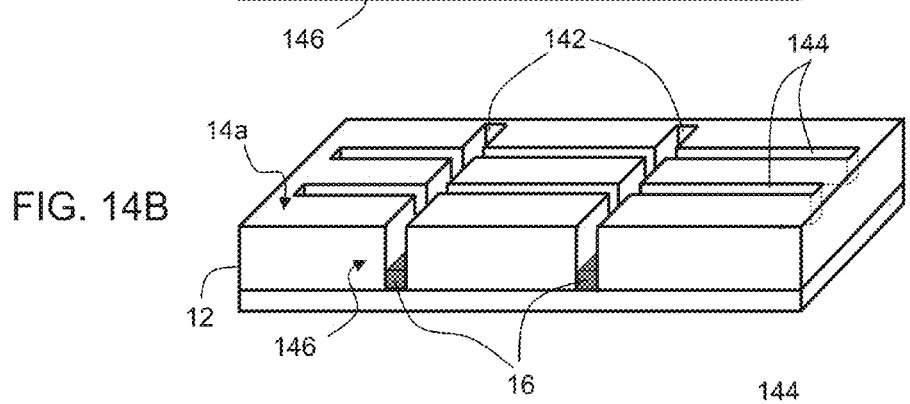
Figure 14C:
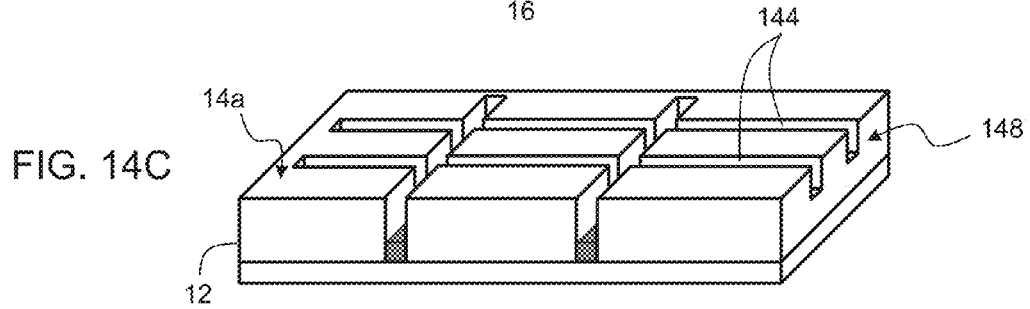

The substrate and trenches 142 and 144 is subjected to nanostructure growth process, as further detailed hereinabove. Since only trenches 142 are open, the amount and pressure of vapors near the catalyst at trenches 144 is negligible, so that the nanostructures grow within trenches 142 but not within trenches 144. FIG. 14B shows the nanostructures 16 within trenches 142.

Once the nanostructures within the first group 142 of trenches are grown, openings 148 (see FIG. 14C) are formed at the ends of the trenches of group 144, as further detailed hereinabove. Openings 148 are formed at the ends which are distal to the catalyst in trenches 144.

Figure 14D:
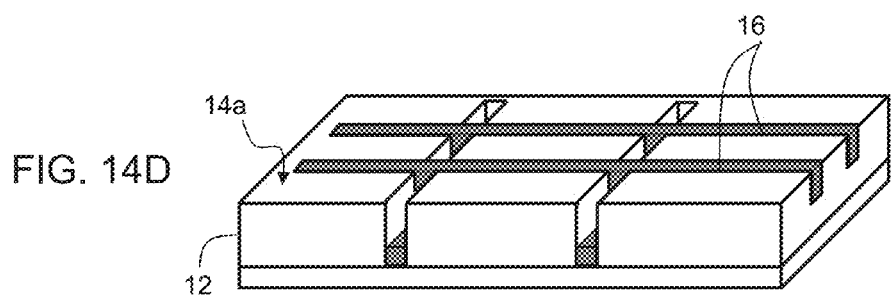

The substrate is then subjected again to growth of nanostructures. Since trenches 144 are now open at one side, a guided growth of nanostructures occurs within these trenches. FIG. 14D shows the nanostructures 16 within trenches 144.

The thickness of the nanostructures generally depends on the sizes of the catalyst and trenches. Thus, the depths of the trenches and size of the catalyst are selected according to the desired thickness of the nanostructures.

For example, when it is desired to form a crossbar array in which there is no contact between the nanostructures in one group and the nanostructures in the other group, the trenches of the lower group (group 142 in the present example) are made sufficiently deeper than the trenches of the upper group and the catalyst is made sufficiently thin. Specifically, in these embodiments, the thickness of the catalyst in the lower trenches is less than D-d. It was found by the present inventors that with such a configuration, the nanostructures in the lower group grow sufficiently below the upper trenches.

Conversely, when it is desired to form a crossbar array in which the nanostructures in one group contact the nanostructures in the other group, the thickness of the catalyst in the lower trenches can be made approximately equal to D-d. It was found by the present inventors that with such a configuration, the nanostructures in the lower group grow just below the upper trenches, so that when the upper the nanostructure grow, they contact the nanostructures of the lower group.

In some embodiments, the substrate, the method of forming the trenches, the optional adhesive layer, the catalyst material, the material used for forming the protecting layer, the material used for forming the resist layer, and the material used for growing the nanostructure, as well as the means for forming and/or removing the layers/components, are selected so as to achieve a selective action at each stage of the process. Thus, for example, the adhesive layer is selected to couple to both the substrate and the catalyst material, the catalyst material and/or the protective layer, and the conditions for removing the portion of the catalyst material and/or the protective layer are selected such that the formed nanostructures remain intact; the resist layer used for defining the openings is selected such that its removal do not affect the trenches.

It is noted that the methodology described herein has been exemplified while utilizing silicon/silicon oxide substrates, silicon oxide capping layer and while growing silicon nanowires. The conditions and reagents required for successfully practicing the methodology with these materials should be of high selectivity, in view of the similar nature of the components, thus demonstrating the versatility of the disclosed methodology and the ability to perform it while utilizing any combination of materials in general and any combination of the materials used as a substrate, as a capping layer and for growing the nanowire.

Embodiments of the present invention therefore encompass any selected combination of a semiconductor material for growing the nanostructure, a substrate material (including a base layer material and an additional layer material, if present) and a capping layer, including a selected combination of those semiconductor materials, substrate materials and capping layers recited herein as representative examples.

Embodiments of the present invention therefore encompass any selected combination of a semiconductor material for growing the nanostructure, a resist layer and a capping layer, including a selected combination of those semiconductor materials, resist layers and capping layers recited herein as representative examples.

Embodiments of the present invention therefore encompass any selected combination of a semiconductor material for growing the nanostructure, a catalyst material and a capping layer, including a selected combination of those semiconductor materials, catalyst materials and capping layers recited herein as representative examples.

Embodiments of the present invention therefore encompass any selected combination of a semiconductor material for growing the nanostructure, a catalyst material and a resist layer, including a selected combination of those semiconductor materials, catalyst materials and resist layers recited herein as representative examples.

Embodiments of the present invention therefore encompass any selected combination of a semiconductor material for growing the nanostructure, a substrate, a resist layer, a catalyst material and/or a capping layer, including a selected combination of those semiconductor materials, substrate materials, catalyst materials, resist layers and/or capping layers recited herein as representative examples.

Any of the herein described combinations can be selected by those skilled in the art.

As demonstrated in the Examples section that follows, the process described herein was successfully practiced for synthesizing Si, Ge and SiGe nanowires, with a wide variety of two-dimensional shapes. Thus, on-surface semiconductor nanowires were grown via the vapor-liquid-solid (VLS) mechanism, with a wide variety of two dimensional shapes such as kinked (different turning angles), sinusoidal, linear and spiral shapes, demonstrating the ability to practice any desired geometry. Nanowires were shown to be grown on a variety of substrates, including silicon wafer, quartz, glass slides and even on plastic substrates (e.g. Kapton HN). The dimensions of the nanowires were determined according to the channel width and the thickness of the evaporated sacrificial layer.

The process disclosed herein therefore allows manufacturing nanostructures with pre-determined, tightly controlled density, position and number of nanowires synthesized. Utilizing the disclosed process allows growing highly-complex nanowire systems, such as controlled crossbars arrays, branched nanowire structures, nanotubular optical on-surface elements and 3D nanowire-based probes for scanning microscopy applications.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Materials and Methods

Materials and Systems:
Unless otherwise stated, all materials were used as purchased from the indicated supplier.
Oxidized silicon wafers were obtained from Silicon Quest international.
Kapton NH substrate was obtained from DuPont.
Quartz substrates were obtained from various vendors.
Gold was purchased from various vendors.
ZEP520A resist and ZED-N50 developer were purchased from Zeon Chemicals.
Dimethylacetamide and gold etchant ($KI/I_2/H_2O$ solution) were purchased from Sigma-Aldrich.
LOR-3A copolymer, PG remover (trade name; NMP (N-Methyl-2-pyrrolidone), and S-1805 resist were purchased from MicroChem. Corp.
Polyimide Pyralin PI 2808 was purchased from HD MicroSystems.
MF 319 developer (trade name) was purchased from Shipley.
Methyl isobutyl ketone (MIBK) were obtained from Sigma.
Chemical vapor deposition was performed using a home-built hot-wall chemical vapor deposition system.
Reactive Ion Etching was performed using HDP/RIE (High Density Plasma/Reactive Ion Etcher) Nextral 860.
Sample Characterization:
SEM images were obtained using FEI Quanta 200 field emission gun (FEG) environmental scanning electron microscope (ESEM).
Crystallographic microscopic properties of the wires were analyzed by an electron backscattered diffraction (EBSD) system using HKL-Oxford Channel 5 with a Nordlys II detector under the following conditions: 70° tilt position relative to main e-beam, 15 mm working distance, and 20 keV main electron beam energy. The EBSD was performed in an FEI Quanta 200 field emission gun (FEG) environmental scanning electron microscope (ESEM). EBSD Kikuchi patterns were collected from selected points on the secondary electron (SE) wire image for nanoscale crystallographic information.
Electrical measurements were performed as previously described.

Example 1

Synthesis of Shape-Controlled Si and Ge Nanowires on Substrates

Synthesis of Shape-Controlled Si and Ge Nanowires on Silicon Substrates:
A schematic outline of an exemplary general procedure for synthesizing Si or Ge nanowires on a silicon wafer substrate, according to some embodiments of the invention, is depicted in FIGS. 1A-K, as follows.
Preparation of Pre-Treated Silicon Wafers (FIG. 1A):
Wafers are cleaned by soaking in organic solvent(s) and rinsing in deionized water, and upon drying, the cleaned wafers are coated with resist layer, as depicted in FIG. 1A.

In an exemplary procedure, silicon wafers, optionally containing a silicon oxide layer (e.g., a 600 nm-thick thermal silicon oxide ($SiO_2$) layer), were pretreated by soaking in acetone and isopropyl alcohol (IPA), each for a period of 5 minutes, followed by rinsing with deionized water, and subsequent soaking in a mixture containing $H_2SO_4$ (97% in water) and $H_2O_2$ (30% in water) in a ratio of 3:1, respectively, for about 5 minutes. The wafers were thereafter thoroughly rinsed with deionized water and dried under a dry nitrogen stream. The cleaned wafers were coated with ZEP520A resist by spinning, using a spin coater operated at 5000 rpm for 60 seconds, followed by baking for 3 minutes at 180° C. on a hotplate.

Silicon Wafer Patterning (FIGS. 1B-C):

Open trenches of a desired shape, size, number, density, orientation, and location are patterned by electron-beam direct writing on the resist film layer deposited on the wafer, as depicted in FIG. 1B.

Alternatively, patterning is effected by nanoimprint lithography (NIL) masks of the desired properties.

The formation of trenches is done by chemical dry etching in a reactive ion etcher (RIE), as depicted in FIG. 1C. The depth of the shape-controlled trench can be modulated between 10 nm to 500 nm.

In an exemplary procedure, pretreated silicon wafers coated with ZEP520A resist, prepared as described hereinabove, were patterned by electron-beam lithography to inscribe pre-determined trenches, having a variety of dimensions, shapes, and orientations, as desired, as exemplified in FIG. 1B for a kinked nanowire structure.

The patterned wafer was developed by immersing in ZED-N50 developer for 30 seconds, followed by rinsing with methyl isobutyl ketone (MIBK) for 10 seconds and then drying under a dry nitrogen stream.

The desired trenches in the $SiO_2$ layer were produced by chemical dry etching in a reactive ion etcher (RIE) using the following conditions: $CHF_3$ flow rate 50 sccm, $O_2$ flow rate 2 sccm, He flow rate 15 sccm, total pressure 15 mTorr, and RF plasma 40 W, so as to obtain a trenched wafer.

Gold Deposition (FIGS. 1D-E):

The trenches are then filled with gold, which functions both as the sacrificial material needed for defining the enclosed channels (as detailed hereinafter and shown in FIG. 4) and as the catalyst for VLS growth of the nanowires, as depicted in FIG. 1D. An adhesion layer can be applied by, e.g., electron-beam deposition, prior to gold deposition. Subsequently, the resist film is lifted-off to reveal the gold-filled lines on the substrate, as depicted in FIG. 1E.

In an exemplary procedure, a 1.5 nm-thick layer of titanium was applied by electron-beam evaporation. Thereafter, a 50 nm layer of gold was evaporated on the surface of the wafer by electron-beam evaporation at a base pressure of $10^{-7}$ Torr and an evaporation rate of 1 nm/s, to thereby obtain a trenched wafer coated with gold.

The resist layer removal was performed by immersion in N,N-Dimethylacetamide for 30 minutes, followed by rinsing with deionized water and IPA for 5-10 seconds, and drying under a dry nitrogen stream.

Formation of Enclosed Tunnels (FIGS. 1F-H):

The openings of the tunnels are defined by photolithography, as depicted in FIG. 1F, and a capping layer (e.g., a silicon dioxide capping layer) is deposited over the substrate (e.g., by ICP-PECVD), as depicted in FIG. 1G. The remaining resist is lifted-off, as depicted in FIG. 1H, and the gold buried under the capping layer is controllably removed by wet etching, using a standard gold etchant, so as to form shape-controlled nano-tunnels, as depicted in FIG. 1I.

Short (e.g., on the order of several hundreds of nm, and optimally less than 200 nm) lengths of gold slugs are left at the end of the nano-tunnel in order to serve as catalysts for the growth of nanowires during the VLS step. Gold segments of higher length may lead to splitting of the metal catalyst during the nanowire growth and to nanowires of lower quality. Thus, the etching process is stopped by immersion of the substrate in deionized DI water. The duration of the etching process, until it is stopped can be determined by microscope evaluation of the process progress and/or by reference to a respective calibration curve.

In an exemplary procedure, deposition of LOR-3A copolymer, followed by deposition of S-1805 resist on the substrate, were each performed by spinning at 4000 rpm for 40 seconds, followed by baking at 185° C. for 5 minutes and at 110° C. for 1.5 minutes on a hotplate. The photo-patterned wafer was then developed by immersion in MF 319 developer for 1 minute, followed by rinsing with water for 10 seconds, and drying under a dry nitrogen stream.

Deposition of a silicon dioxide capping layer was then performed, using Inductively Coupled Plasma Chemical Vapor Deposition (ICP-PECVD) at 150° C. with a $SiH_4$ flow rate of 200 sccm, $O_2$ flow rate of 50 sccm, total pressure 80 mTorr, and ICP plasma 300 W with bias plasma 50 W.

The remaining resist was removed by lifting-off in a PG remover at 70° C. for 30 minutes. The wafer was thereafter rinsed with deionized water and IPA for 5-10 seconds and dried under a dry nitrogen stream, to thereby remove the cover of the cavity opening and exposing the gold tunnels.

The sacrificial gold layer which has been buried under the silicon dioxide capping layer was then removed in a controllable manner by wet etching with a standard gold etchant. The etching process was stopped by immersion of the substrate in deionized DI water. Stopping the etching process was determined as described hereinabove.

Formation of Patterned Nanowires (FIGS. 1J-K):

Growth of Si or Ge nanowires is then performed in a CVD reactor using a hot-wall or cold-wall CVD reactor, via the VLS process, as depicted in FIG. 1J. Finally, the silicon dioxide capping layer is removed by chemical dry etching in a reactive ion etcher (RIE), as depicted in FIG. 1K, to thereby obtain in-wafer shape-controlled semiconductor nanowires.

The duration of the CVD is preferably controlled so as to terminate once the tunnel is filled. Otherwise, in case the CVD process is continued, nanowires escape out from the nanotunnel confinement, leading to the growth of unguided nanowires of larger diameters (see, for example, FIGS. 3A-B).

In an exemplary procedure, Si nanowires were formed by CVD carried out at 460° C., using $SiH_4$ at a flow rate of 5 sccm, diluted with Ar at a flow rate of 10 sccm, at 25 Torr.

In another exemplary procedure, Ge nanowires were formed by CVD carried out at 280° C., using 10% $GeH_4$ at a flow rate of 40 sccm, diluted with $H_2$ at a flow rate of 200 sccm, at 400 Torr.

Removal of the silicon dioxide capping layer by chemical dry etching in a reactive ion etcher (RIE) was performed using the following conditions: $CHF_3$ flow rate 100 sccm, $O_2$ flow rate 3 sccm, He flow rate 15 sccm, total pressure 50 mTorr and RF plasma 200 W.

Synthesis of Shape-Controlled Si and Ge Nanowires on Other Substrates:

Using the above-described procedure, Si and Ge shape-controlled nanowires are produced on various surfaces, while adjusting the surface pretreatment procedure if and as desired.

For example, shaped-controlled nanowires are grown on a Kapton HN surface. The Kapton film is pretreated by cleaning with oxygen plasma and is thereafter coated with a polyimide so as to improve its roughness. The pre-treated Kapton film is then subjected to the same synthetic pathway as described for pretreated silicon wafers (and depicted in FIGS. 1A-K), while omitting the step of RIE etching.

In an exemplary procedure, a Kapton film was pretreated by cleaning with oxygen plasma under the following conditions: 100 W and 50 sccm $O_2$ for 180 seconds. The film was thereafter coated with polyimide Pyralin PI 2808, by spin coating using a 5 second spin at 500 rpm, followed by 30 seconds at 2000 rpm. Thereafter, the film was fully polymerized by baking at 100° C. for 60 minutes, 200° C. for 30 minutes and then 300° C. for 60 minutes. The pre-treated Kapton film was then reacted as described hereinabove for silicon wafers.

Similarly, the procedure described herein for growing silicon nanostructures in a silicon/silica wafers was used for growing nanostructures on a quartz substrate.

Example 2

Experimental Results

Morphology- and Shape-Controllable Nanowires:

Scanning electron microscope (SEM) images of exemplary nanowires, featuring a wide variety of 2D shapes, prepared on silicon wafers as described in Example 1 hereinabove, are presented in FIGS. 2A-K, demonstrating the full capacity of the shape-guiding growth methodology disclosed herein.

As shown in FIGS. 2A-D, kinked Si and Ge nanowire structures with different turning angles of between 80°-120° were successfully produced. As can be seen in FIGS. 2E-G, sinusoidal nanowires with different periods were successfully prepared. As can be seen in FIG. 2h, even more complex shapes like spirals were successfully prepared.

As can be seen in FIG. 2I, controllability can be achieved also by modulating the morphology of the nanowire along its axial direction, by the selected trenching. Thus, it is shown that continuous nanowires of high morphological quality are obtained even at the sharpest turning angles.

The obtained SEM images further confirm that nanowire growth is performed via a VLS catalytic process throughout the entire synthesis. Thus, for example, the yellow arrows in FIGS. 2A, 2C and 2E point on the tip of the growing wire, were the gold catalyst is clearly visible.

The VLS-based growth of the nanowires is further supported by the SEM images presented in FIGS. 3A-B. As shown therein, when the CVD procedure is allowed to proceed, nanowires escape out from the nanotunnel confinement, resulting in the growth of unguided nanowires of larger diameters. Notably, these results show that the gold catalyst droplet adopts the shape and dimensions of the nano-tunnel under confinement, finally leading to nanowires reflecting the shape of the original nano-tunnels.

As can be seen in FIGS. 4A-D, the thickness of the nanowire can be controlled by the thickness of the deposited sacrificial gold layer within the tunnels. Thus, nanowires of various widths have been prepared.

FIGS. 5A-B show the feasibility and controllability of shape-guided nanowire growth on substrates other than silicon wafers. Thus, FIG. 5A presents a SEM image, taken under low vacuum conditions (or obtained using a low vacuum SEM mode), of a sinusoidal Si nanowire obtained on a quartz substrate. FIG. 5B presents a SEM image, taken under similar conditions, of a linear Ge nanowire grown on a Kapton substrate.

These results demonstrate that the disclosed methodology allows for the direct growth of nanowires on Kapton substrates at temperatures as high as 450° C., without any visual deterioration of the Kapton surfaces. Without being bound by any particular theory, it is suggested that the silicon oxide layer deposited on top of the kapton substrate protects the plastic surface from thermal degradation during the nanowire growth.

It is therefore demonstrated that the disclosed methodology can be applied for the controlled in-place growth of semiconductor nanowires directly on temperature-sensitive and/or flexible substrates, a feature of great potential for future electronic, optoelectronic and sensing devices.

Overall, it is demonstrated that the disclosed synthetic approach allows for a perfect control of the 2D and 1D morphologies of the resulting nanowire elements. These results indeed provide a clear demonstration that this method is universal and can be utilized to achieve semiconductor nanowire structures of any desired 2D geometry, on any substrate.

Crystallographic Properties:

Electron backscattered diffraction (EBSD) method was utilized for obtaining the nanowire crystallographic properties at high resolution, in similarity to previous studies [see, Prikhodko et al. *Ultramicroscopy* 2008, 109, (1), 133-138; Deal et al. *Surface and Interface Analysis* 2005, 37, (11), 1017-1020; and Barkay et al. *Journal of Superconductivity and Novel Magnetism* 2008, 21, (2), 145-150]. FIGS. 6A-D present the data obtained for Si nanowires of various shapes (FIGS. 6A-C) and for multi-kinked Ge nanowires (FIG. 6D). As can be seen therein, all the on-wafer grown nanowires exhibit crystalline structures. Clearly, nanowires confined to the nanotunnels can adopt any shape, even sharp at turning angles, without leading to termination of nanowires growth. The EBSD results show that nanowires are highly crystalline along their whole length.

Electrical Measurements:

Electrical measurements were performed using an electrical device as shown in the inserts of FIG. 7. Measurements were performed on a straight section of a zigzagged (multi-kinked; black curve) and on a linear (red curve) Si nanowire structure. As shown on FIG. 7, the presence of the kink/turning point does not negatively affect the electrical performance of the nanowire, thus further indicating that the nanowire is continuous and of high morphological quality along its whole length, even at the kinking/turning points.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A process of fabricating a nanostructure, the process comprising:
   providing a substrate,
   forming a trench in the substrate,
   placing a metal catalyst in the trench, wherein the metal catalyst is select for catalyzing nanostructure growth,
   covering the substrate, the metal catalyst and the trench with a protective layer,
   growing a buried nanostructure in situ within the trench, wherein the buried nanostructure is formed within the substrate, and wherein the substrate comprises a major surface; and
   removing the protective layer, wherein the nanostructure remains buried within the trench, and wherein removing the protective layer exposes the nanostructure at the major surface;
   wherein said placing comprises evaporating a metal catalyst material into said trench so to at least partially fill said trench by said metal catalyst material, and etching a portion of said metal catalyst material off said trench under controlled conditions selected so as to maintain a remnant of said metal catalyst material within said trench;
   wherein said evaporating said metal catalyst material into said trench comprises, evaporating said metal catalyst material onto a surface of said substrate including said trench, and removing said metal catalyst material from said surface, thereby leaving said metal catalyst material only in said trench; and
   wherein said removing said metal catalyst material from said surface is effected by a liftoff process.

2. The process according to claim 1, wherein said growth is under conditions that the direction of growth is parallel, or with a deviation of less than 10° (degrees) from parallelism, to the major surf ace of said substrate.

3. The process according to claim 1, wherein said trench has an open end and a closed end, wherein said metal catalyst is at said closed end and wherein said growth is generally along a direction pointing from said closed end to said open end.

4. The process according to claim 1, wherein said metal catalyst occupies a length of at most 300 nm along a lengthwise direction of said trench.

5. The process according to claim 1, wherein a linear distance between a first end of said trench and a second end of said trench is at least 1 µm.

6. The process according to claim 1, wherein said substrate is formed with a plurality of trenches and wherein the process comprises growing a nanostructure in situ within at least two of said plurality of trenches.

7. The process according to claim 1, wherein said forming said trench is effected by a lithography process followed by an etching process.

8. The process according to claim 1, wherein said trench is a branched trench having at least one branch point connecting a first trench section entering said branch point with trench sections exiting said branch point.

9. The process according to claim 8, wherein said growing is along a direction from said first trench section, pass said branching point and into each of said trench and into at least two of said trench sections exiting said branch point.

10. The process according to claim 1, further comprising forming an opening in said protective layer at an end of said substrate to form an open-ended trench.

11. The process according to claim 1, wherein said substrate is formed with a plurality of trenches arranged to form a crossbar array having at least a first group of trenches having a first depth, and a second group of trenches having a second depth being smaller than said first depth, and wherein said growing comprises, growing nanostructures within said first group of trenches without growing nanostructures within said second group of trenches, and subsequently growing nanostructures within said second group of trenches.

12. The process according to claim 11, wherein during said growth of said nanostructures within said first group, the trenches in said first group are open at one side and the trenches in said second group are closed both sides, and wherein the process further comprises, forming an opening at one side of said trenches in said second group, prior to said growth of said nanostructures within said second group.

13. The process according to claim 1, wherein said growing is effected by chemical vapor deposition.

14. The process according to claim 1, wherein said nanostructure is made of a semiconductor material.

15. The process according to claim 14, wherein said semiconductor material comprises at least one material selected from the group consisting of silicon, germanium, silicon-germanium alloy, silicon carbon alloy, silicon-germanium-carbon alloy, gallium nitride, gallium arsenide, indium arsenide, indium phosphide, indium nitride, a III-V compound semiconductor material, a II-VI compound semiconductor material, and an organic semiconductor material.

16. The process according to claim 1, wherein said metal catalyst comprises at least one material selected from the group consisting of gold, nickel, aluminum, cobalt, silver, copper, platinum, chromium, titanium, palladium and iron.

17. The process according to claim 1, wherein said substrate is made of at least one material selected from the group consisting of silica, silicon, GaN, InP, GaAs, InGaP, $Si_3N_4$, $Al_2O_3$, ZnO, $ZrO_2$, quartz, glass, a polymer or copolymer and plastic, and any combination thereof.

18. The process according to claim 1, wherein said trench has a shape selected from the group consisting of straight, kinked, wavy, curvilinear, spiral, serpentine, cycloid and any combination thereof.

19. The process according to claim 1, wherein at least part of said trench has a shape of a space curve.

20. The process according to claim 1, further comprising selectively removing walls of said trench, such that the nanostructure forms a relief pattern over so an exposed surface of said substrate.

21. A process of fabricating nanostructures, the process comprising:
   growing the nanostructures in situ within a plurality of trenches formed in a substrate and having in said trenches metal catalysts selected for catalyzing said growth, wherein said growth is guided by said trenches;
   wherein said plurality of trenches are arranged to form a crossbar array having at least a first group of trenches having a first depth, and a second group of trenches having a second depth being smaller than said first depth;
   wherein said growing comprises, growing nanostructures within said first group of trenches without growing nanostructures within said second group of trenches, and subsequently growing nanostructures within said second group of trenches;
   wherein during said growth of said nanostructures within said first group, the trenches in said first group are open at one side and the trenches in said second group are closed both sides; and wherein the process comprises covering a surface of said substrate by a protective layer such as to bury said trenches under said protective layer, and forming an opening at one side of said trenches in said second group, prior to said growth of said nanostructures within said second group.

* * * * *